(12) United States Patent
Tobin et al.

(10) Patent No.: US 6,535,945 B1
(45) Date of Patent: Mar. 18, 2003

(54) METHOD AND APPARATUS FOR PROGRAMMABLE ADJUSTMENT OF COMPUTER SYSTEM BUS PARAMETERS

(75) Inventors: Garry M. Tobin, Atkinson, NH (US); Joseph P. Coyle, Leominster, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/387,120

(22) Filed: Aug. 31, 1999

(51) Int. Cl.[7] .......................................... H03K 19/0175
(52) U.S. Cl. ........................................ 710/305; 326/86
(58) Field of Search ........................... 710/305; 326/30, 326/17, 21, 86; 327/108, 308

(56) References Cited

U.S. PATENT DOCUMENTS

| | | | |
|---|---|---|---|
| 4,375,051 A | * 2/1983 | Theall | 327/518 |
| 4,451,886 A | 5/1984 | Guest et al. | |
| 4,691,294 A | 9/1987 | Humpleman | |
| 4,716,525 A | 12/1987 | Gilanyi et al. | |
| 4,797,815 A | 1/1989 | Moore | |
| 4,864,496 A | 9/1989 | Triolo et al. | |
| 4,881,165 A | 11/1989 | Sager et al. | |
| 5,291,123 A | * 3/1994 | Brown | 323/312 |
| 5,333,192 A | * 7/1994 | McGinn | 379/402 |
| 5,359,235 A | 10/1994 | Coyle et al. | |
| 5,406,147 A | 4/1995 | Coyle et al. | |
| 5,431,182 A | * 7/1995 | Brown | 137/487.5 |
| 5,450,572 A | 9/1995 | Ruedinger et al. | |
| 5,452,436 A | 9/1995 | Arai et al. | |
| 5,461,330 A | 10/1995 | Gist et al. | |
| 5,479,123 A | 12/1995 | Gist et al. | |
| 5,523,721 A | * 6/1996 | Segawa et al. | 330/144 |
| 5,534,811 A | 7/1996 | Gist et al. | |
| 5,574,866 A | 11/1996 | Smith et al. | |
| 5,592,658 A | 1/1997 | Noam | |
| 5,600,824 A | 2/1997 | Williams et al. | |
| 5,634,014 A | 5/1997 | Gist et al. | |
| 5,654,653 A | 8/1997 | Coyle et al. | |
| 5,657,456 A | 8/1997 | Gist et al. | |
| 5,666,078 A | 9/1997 | Lamphier et al. | |
| 5,680,060 A | * 10/1997 | Banniza et al. | 326/30 |
| 5,687,330 A | 11/1997 | Gist et al. | |
| 5,705,937 A | * 1/1998 | Yap | 326/30 |
| 5,781,028 A | * 7/1998 | Decuir | 326/21 |
| 5,819,053 A | 10/1998 | Goodrum et al. | |
| 5,955,894 A | 9/1999 | Vishwanthaiah et al. | |
| 6,078,979 A | * 6/2000 | Li et al. | 709/203 |
| 6,233,177 B1 | * 5/2001 | Shokouhi et al. | 326/80 |
| 6,307,791 B1 | 10/2002 | Otsuka et al. | |

* cited by examiner

Primary Examiner—Paul R. Myers
(74) Attorney, Agent, or Firm—Kudirka & Jobse, LLP

(57) ABSTRACT

A system for programmatically adjusting electrical characteristics of a bus interface so as to modify bus operating and signaling parameters employs a control module or mechanism, responsive to a digital signal, for setting the characteristic's value. The electrical characteristic can be a voltage determinative, for example, of any of the following bus operating and signaling parameters: driver output rise time, driver output fall time, driver voltage limits, driver propagation time, receiver threshold voltage levels, or termination resistance. The digital signal can be generated, for example, by a computer-executable program, a controller, or other such device, that applies the digital signal to the control mechanism, for example, via a JTAG interface/controller.

20 Claims, 19 Drawing Sheets

METHOD AND APPARATUS FOR PROGRAMMABLE ADJUSTMENT OF COMPUTER SYSTEM BUS PARAMETERS

RELATED APPLICATIONS

The present patent application is related to the following, commonly-assigned U.S. patent applications, which are incorporated by reference herein in their entirety:

1) Ser. No. 09/387,660, entitled "Method And Apparatus For Operational Envelope Testing of Busses to Identify HALT Limits" (P3587), filed on even date herewith by Joseph P. Coyle and Garry M. Tobin.
2) Ser. 09/386,564, entitled "Method and Apparatus for Bus Parameter Optimization Using Probes of System Configurations" (P03724), filed on even date herewith by Joseph P. Coyle and Garry M. Tobin.
3) Ser. No. 09/386,563, entitled "Method and Apparatus for Programmable Adjustment of Bus Driver Propagation Times" (P3621), filed on even date herewith by Garry M. Tobin and Joseph P. Coyle.
4) Ser. No. 09/386,809, entitled "Method and Apparatus for Programmable Adjustment of Bus Termination Resistance" (P3623) filed on even date herewith by Garry M. Tobin and Joseph P. Coyle.
5) Ser. No. 09/387,320, entitled "Method and Apparatus for Inducing Bus Saturation During Operational Testing of Busses Using a Pattern Generator" (P3624) filed on even date herewith by Joseph P. Coyle and Garry M. Tobin.
6) Ser. No. 09/386,553, entitled "Method And Apparatus For Extracting First Failure And Attendant Operating Information From Computer System Devices" (P3625) filed on even date herewith by Garry M. Tobin and Joseph P. Coyle.
7) Ser. No. 09/386,985, entitled "Method and Apparatus for HASS Testing of Busses Under Programmable Control" (P3723) filed on even date herewith by Joseph P. Coyle and Garry M. Tobin.

FIELD OF THE INVENTION

This invention relates generally to computer systems, and more particularly to computer interconnection sub-systems commonly called buses, and to techniques for establishing bus operating parameters.

BACKGROUND OF THE INVENTION

As is known in the art, bus adapters and other devices are connected to a bus through bus interfaces. A bus interface is typically specifically designed for a particular type of bus, and is responsible for complying with the signaling requirements of the bus, sometimes called its "bus protocol", including its electrical, physical and logical characteristics for reliable bus transfers. The bus interface generally includes bus drivers and bus receivers to send and receive, respectively, signals over the bus in accordance with the bus protocol. Essentially, each device connected to the bus has a separate instance of a bus interface for each line of the bus, each including a driver for driving that line and a receiver for sensing and resolving voltages on that line into logic states. Bus protocols are typically specified by manufacturers and often by standards-making organizations. Bus adapters include bus interfaces for each of the buses to which they are connected.

Computer system architecture has advanced dramatically in performance and complexity. In terms of performance, computer systems can achieve higher clock speeds with increased bus widths and lower bus operating voltages. Increased bus clock speeds, measured usually in megaHertz (MHz) can allow data to be transferred faster over the computer system's buses, thereby allowing computer applications to run faster. The size of a bus, known as its width, corresponds generally to the number of data lines in the bus and determines how much data can be transmitted in parallel at the same time; thus, wider buses typically transfer data faster. Lower bus operating voltages can advantageously also reduce power consumption, which is important, for example, in miniaturization of integrated circuits and in mobile computing for extending battery operating times. Unfortunately, lower operating voltages can make bus signals more susceptible to signaling errors due to lower signal-to-noise ratios and to signal distortion. Such noise and signal distortion can make it difficult for bus receivers to differentiate correctly between data logic states, thus potentially yielding erroneous data.

Transient and other non-predictable errors in the received data signals can also arise from other causes as well, and often have a deleterious impact on computer system performance. Such errors can arise, for example, from degradation over time of bus drivers and receivers in bus interfaces. Bus errors can also arise due to non-compatibility of add-on components such as adapter cards that are integrated into the computer system after installation at a customer site, and connected to one of the computer's buses, e.g., through "plug and play" operation. Where such adapter cards malfunction or simply exhibit operating parameters unanticipated by the original computer manufacturer, data transfer errors can arise on the bus to which they are connected. Such bus errors can result in lost or corrupted data or hanging of the bus protocol so as to prevent completion of a bus transaction. In extreme cases, bus errors can cause system crashes.

Accordingly, while current computer systems perform reasonably well, it would be desirable to improve bus operating and signaling parameters so as to avoid or at least lessen difficulties with respect to bus transfer errors and otherwise to improve bus performance. Such bus operating and signaling parameters are determined, at least in part, by signal characteristics in bus drivers and bus receivers.

Examples of signal characteristics include rise time and fall time of the driver output. "Rise time" refers to the time period between the point at which a driver output starts transitioning from a low voltage state to a high voltage state and the point at which this signal reaches the high voltage state. On the other hand, "fall time" refers to the time period between the point at which a signal starts transitioning from a high voltage state to a low voltage state and the point at which this signal reaches the low voltage state. The rise time characteristic is important to computer system operation because rise time is related to the maximum bus speed, one of the more important bus operating parameters.

Rise time is dictated typically by the high frequency characteristics of the output transistor of the driver. When developing operating specifications for a bus, a computer system designer may determine the shortest typical rise time that the output transistor of the driver will achieve, and then specify the maximum bus speed for all buses using that type of driver based on that lowest rise time. Accordingly, rise time or fall time performance by a driver often is not controlled specifically; rather, the natural rise time and fall time characteristics of the output transistor circuit in the driver are accepted and are used to dictate overall system bus performance. Some designs, however, attempt to control rise time. One approach used in the prior art to control rise time characteristics of the output transistor of the driver is to design into the driver a relatively small resistance in series with an input circuit of the output transistor. The input circuit with the added resistance exhibits a higher resistance-capacitance time constant than a similar circuit without that resistance, which has the effect of slowing down the rise time. One problem with this approach, however, is that such resistances are generally provided as internally integrated devices within the circuit. The tolerance on such a resistance, as currently achievable by standard semiconductor processing techniques, is relatively poor, typically on the order of about 15 percent. This relatively poor tolerance provides too much variation in the rise time characteristics of the transistor to be effective in controlling that parameter.

U.S. Pat. No. 5,657,456 issued to Gist and Coyle on Aug. 12, 1997, entitled "Semiconductor Process Power Supply Voltage and Temperature Compensated System Bus Driver Rise and Fall Time," and incorporated herein by reference, discloses a driver circuit having an input terminal fed by a logic signal and an output terminal including means for setting a rise time for a signal driven from the driver. An external resistor determines the rise time. It would be possible to adjust rise and fall times in that patent by manually swapping out the external resistor for one of a different resistance value, that is, manually disconnecting the external resistor and manually connecting a replacement having a different resistance value.

While potentially effective in controlling rise times, the technique disclosed in that patent has a number of drawbacks. For example, it requires a trained technician to perform modifications to the printed circuit board on which the external resistor is mounted. This procedure may require removal of the computer system from a customer's facility so that the work can be performed at a repair location. There is an attendant risk that the procedure may damage the board or other mounted components. Moreover, such repair may be time consuming and expensive, and typically would require an inventory of replacement resistors. Customers often rely on their computer systems to such an extent that computer "down time" associated with such repair is often unacceptable.

Another example of an important signal characteristic is the threshold voltage at the receiver, which refers to the voltage level between the line high voltage and the line low voltage, above which the receiver resolves the signal into one logic state, and below which into the other logic state. The threshold voltage is often slightly different for each logic state, with the difference between the two threshold voltage levels being an area of uncertainty or indeterminacy. The values of these two threshold voltage levels, and the area of uncertainty between them, can significantly impact the effectiveness with which the receiver resolves received bus signals into logic states. U.S. Pat. No. 5,406,147 issued to Coyle and Gist, entitled "Propagation Speedup By Use of Complementary Resolver Outputs in a System Bus Receiver", and incorporated herein by reference, discloses a mechanism for controlling threshold voltage of a system bus receiver. In that patent, a resolver circuit is fed a bus signal and a reference voltage. A circuit including a sense-amplifier is used to provide an output based on the relationship of the magnitude of the bus signal to that of the reference voltage. Thus, the threshold voltage value is set at a fixed value determined by the value of reference voltage. While the technique disclosed in that patent may be effective in setting the threshold voltage, it would be desirable to control more readily the reference value so to vary the threshold value for particular applications and improve bus operation.

Other patents related to those referenced herein include U.S. Pat. Nos. 5,479,123; 5,534,811; 5,687,330; 5,634,014; 5,654,653; 5,359,235; and 5,461,330 also deal with various aspects of setting bus operating and signaling parameters. The disclosures of those patents are incorporated herein by reference.

Accordingly, it would be desirable to provide a technique for adjusting bus operating and signaling parameters in a straightforward manner, which permits bus transfer errors to be corrected and/or bus performance improved, while also overcoming the drawbacks of prior art techniques.

SUMMARY OF THE INVENTION

The invention resides in a system for programmatically adjusting electrical characteristics of a bus interface so as to modify bus operating and signaling parameters. The adjustment is effected by a control module or mechanism, responsive to a digital signal, for setting the characteristic's value. For example, the electrical characteristic can be a voltage that is determinative, e.g., of any of the following bus operating and signaling parameters: driver output rise time, driver output fall time, driver voltage limits, driver propagation time, receiver threshold voltage levels, or termination resistance. The digital signal can be generated, for example, by a computer-executable program, a controller, or other such device, that applies the digital signal to the control mechanism, for example, via a JTAG interface/controller.

Accordingly, a computer system can be repaired, and/or its performance improved, by having one or more bus operating and signaling parameters adjusted. The adjustment can serve, for example, to correct bus transfer or signaling errors, to insure bus transfers fall within a predetermined target operating envelop, and/or to optimize bus performance. The adjustment can be achieved automatically and dynamically, in real time, e.g., through software control, often without significant involvement by a service technician, offsite repair facilities, or significant downtime of the computer system.

Another aspect of the invention provides a bus interface having a bus driver for driving a corresponding bus line with a driver output signal responsive to an input signal. The driver output signal has a signal parameter responsive to a control signal. A control module generates the control signal for controlling the signal parameter. The control module includes a signal generator for generating the control signal, and a resistance circuit characterized by a resistance value, which is programmably set in response to a digital signal, and with respect to which the control signal varies. A digital signal generator can be employed to generate the digital signal. The digital signal generator can include, e.g., a processor executing a program for setting the digital signal so as to cause adjustment of the control voltage and thereby controlling the signal parameter.

Yet another aspect of the invention provides a bus interface having a bus receiver for receiving a bus signal over a corresponding bus line. The bus receiver is characterized by an operating parameter, such as a threshold voltage, for use in resolving the bus signal into digital logic states. The threshold voltage is responsive to a control signal. A control module generates the control signal for controlling the threshold voltage of the receiver. The control module includes a signal generator for generating the control signal, and a resistance circuit characterized by a resistance value, which is programmably set in response to a digital signal, and with respect to which the control signal varies. The digital signal generator can include, e.g., a processor executing a program for setting the digital signal so as to cause adjustment of the control voltage and thereby controlling the signal parameter.

In another aspect of the invention, the bus interface having the driver and/or receiver, as just described, can be provided with resistance circuitry, including a plurality of resistance cells switchable between active and inactive states in response to the digital signal for setting the control signal. In an exemplary embodiment, the resistance circuitry can include first and second voltage dividers connected in parallel. The first voltage divider can include a serial arrangement of a first resistor and a second resistor having an adjustable resistance. The second voltage divider can include a serial arrangement of a third resistor having a programmable resistance, and a fourth resistor having an adjustable resistance. The resistance of the second and fourth resistors being set, e.g., equal to one another, in response to a second control voltage. The control voltage for controlling the driver output signal is tapped from a node located between the third and fourth resistors. The third resistor can include a programmable, variable resistance circuit having a plurality of resistance cells each characterized by a resistance value. Each resistance cell can include a variable resistance and a switch, e.g., a transistor switch, responsive to a switching signal, for individually connecting the variable resistance into the resistance circuit and thereby individually rendering the resistance cells active. The bus interface can further have a controller, responsive to the digital signal, for generating the switching signals. With this arrangement, the control voltage varies in relation to the number of active resistance cells.

Accordingly, a technique is provided for adjusting bus operating and signaling parameters in a straightforward manner, which permits bus transfer errors to be corrected and/or bus performance improved, while also overcoming drawbacks of prior art techniques.

BRIEF DESCRIPTION OF THE DRAWINGS

The above and further advantages of the invention may be better understood by referring to the following description in conjunction with the accompanying drawings in which.

DETAILED DESCRIPTION OF THE PREFERRED EMBODIMENT

A) Electronic System

Figure 1:
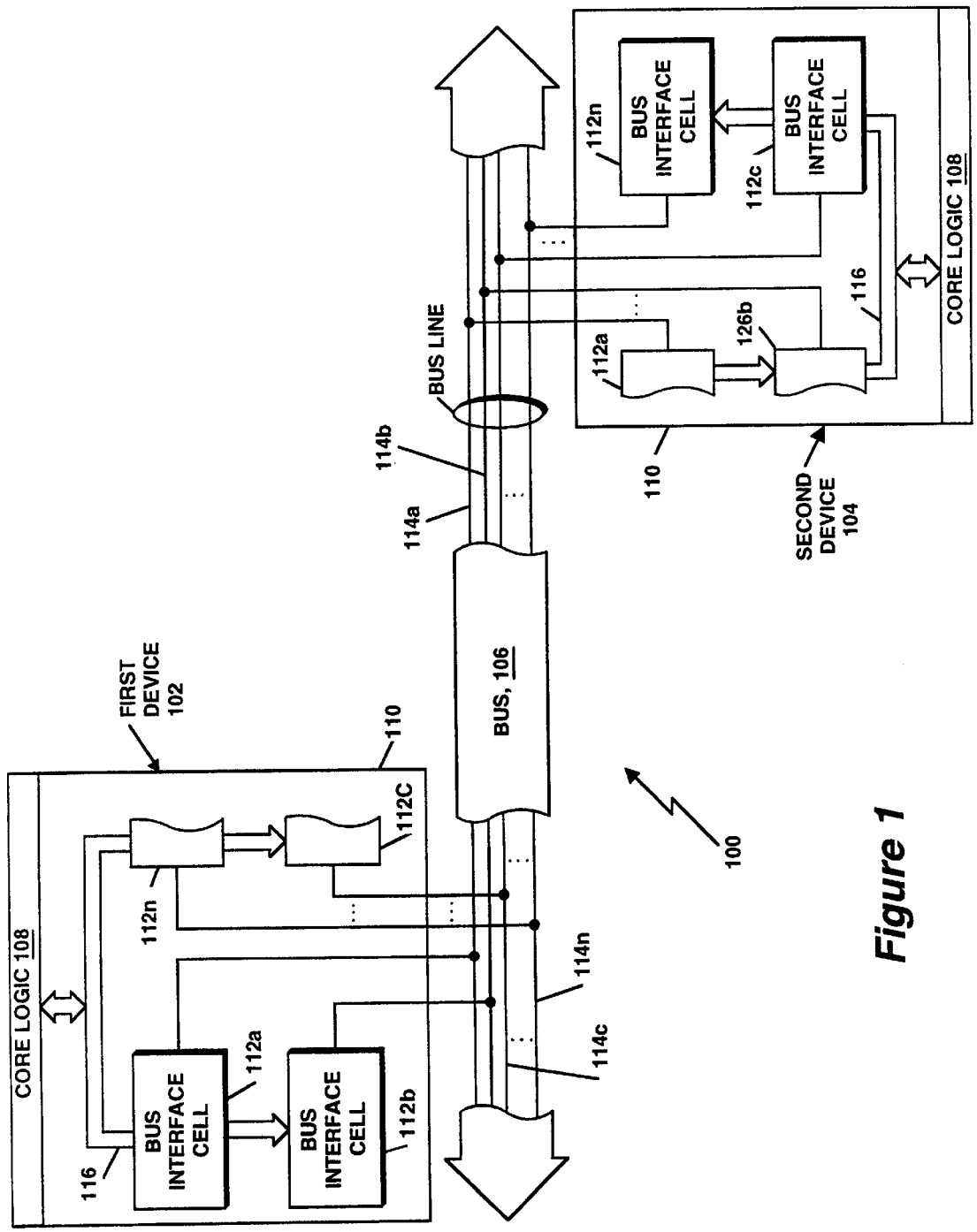
FIG. 1 is a block diagram of an electronic system in which first and second devices communicate over a bus in accordance with an embodiment of the invention.

FIG. 1 shows an electronic system 100 having first and second devices 102, 104 interconnected by a bus 106. While only two such devices are shown for illustrative purposes, the invention can be implemented with any practical number of such devices.

The electronic system 100 can be, for example, a computer system, such as, e.g., a workstation, server, or personal computer. The electronic system 100 can also be, for example, a communication device such as a cellular phone, or even, foreseeably, a video game, entertainment system, or other electronic apparatus or instruments having components interconnected by a bus for communication therebetween. Alternatively, the electronic system 100 can comprise a network of computer systems or other network-capable electronic apparatus or instruments, which are interconnected by a communication channel, which will be referred to herein as a "bus".

Each device 102, 104 has core logic 108, typically including a processor or controller (not shown) and other components (not shown) for performing the device's intended functions, and a bus interface 110. The bus interface 110 includes a plurality of bus interface cells 112a, 112b, ... 112n, e.g., one connected to each conductor or line 114a, 114b, ... 114n of the bus 106 for sending and receiving signals over that line, and thereby collectively providing an Input/Output (I/O) interface between its device 102, 104 and the other device 104, 102. The bus interface cells 112a, ... 112n are interconnected via an interface cell control bus 116. The bus 116 includes reference voltage signal lines, enable signal lines and supply voltage signal lines, as necessary for operation of the cells.

Figure 2:
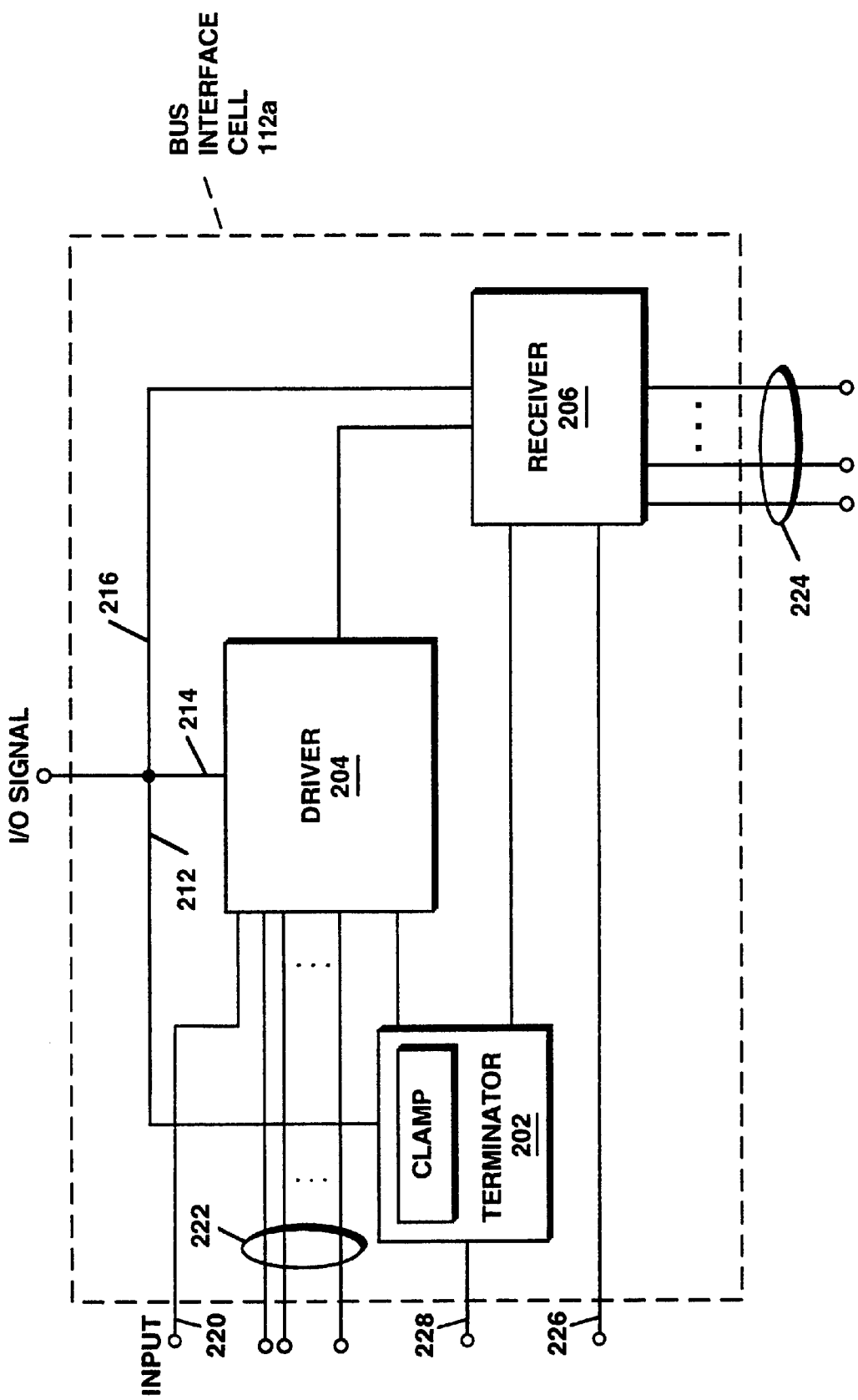
FIG. 2 is a block diagram of a representative bus interface of FIG. 1.
Figure 3A:
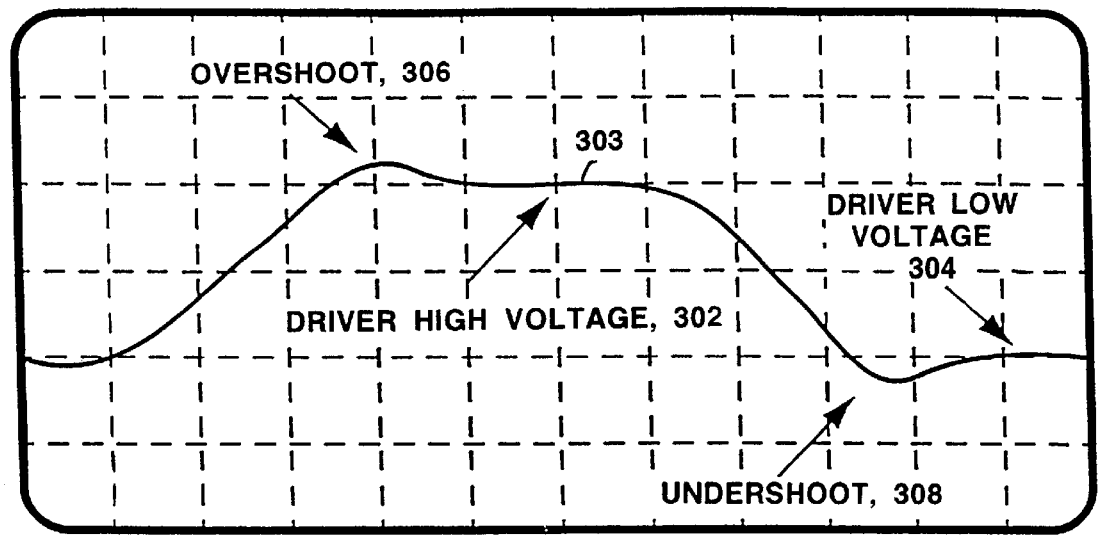
FIG. 3A through FIG. 3E are waveform diagrams illustrating various bus parameters.
Figure 3B:
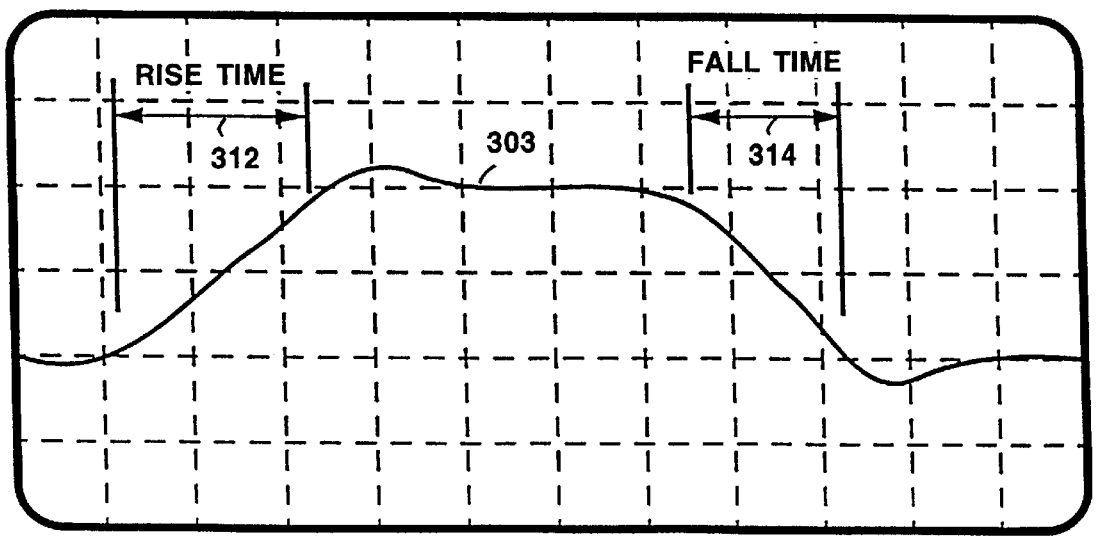
Figure 3C:
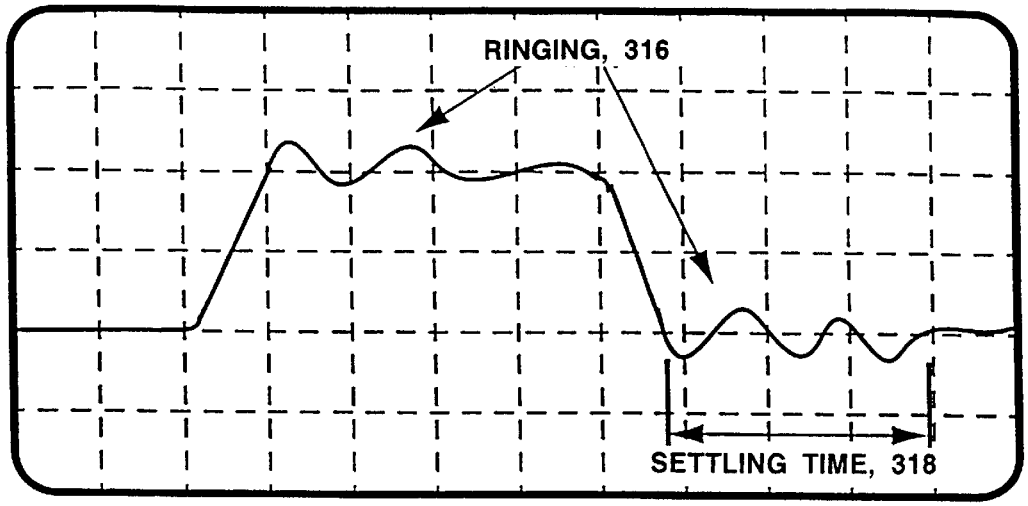
Figure 3D:
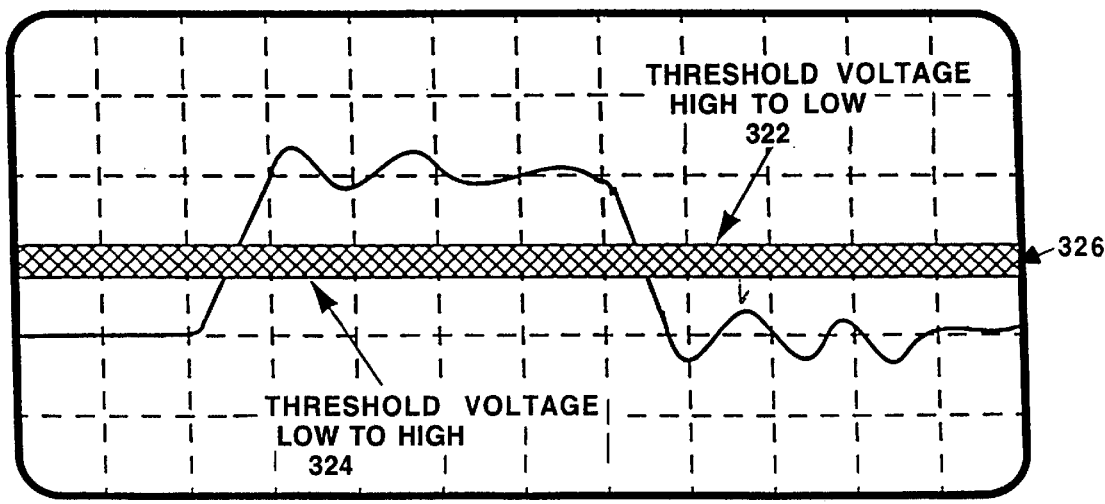
Figure 3E:
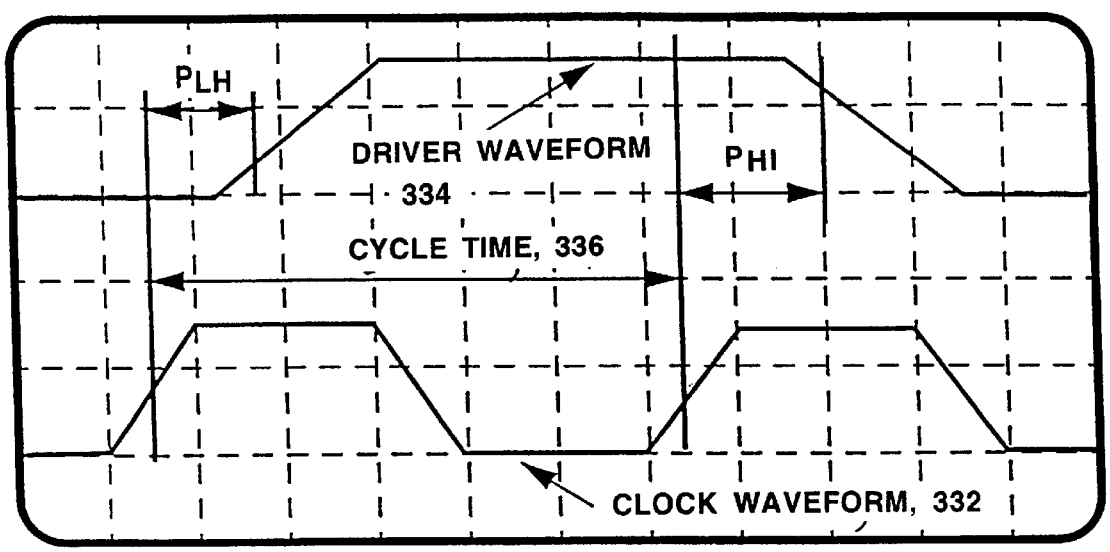

FIG. 2 shows an representative illustration of one of the bus interface cells 112a. The other bus interface cells 112b, ..., 112n can be of the same, illustrated design. The bus interface cell 112a has a termination resistance circuit or terminator 202, a driver 204, and a receiver 206. The termination resistance circuit 202 has an I/O output terminal 212, which is connected to respective I/O terminals 214, 216 on the driver 204 and receiver 206 for establishing a termination resistance for those terminals 204, 206. The driver 204 converts input signals (e.g., from the core logic 108 of first device 102) received over line 220 into corresponding, suitably-formatted driver output signals ("driver output"), which it "Sends" via I/O terminal 214 unto the bus 106 (FIG. 1). The receiver 206 latches an unamplified, unresolved state of an incoming signal on bus line 114a at I/O terminal 216, and resolves that signal into a control, address, or data signal. The driver 204, receiver 206 and terminator 202 receive voltages, including, for example, supply and control voltages over a plurality of lines, including lines 222 for the driver, lines 224 for the receiver, and line 228 for the terminator 202. These various voltages will be described in more detail below.

B) Waveform Terminology

It may prove useful to introduce certain terminology and abbreviations used in this specification, with reference to FIGS. 3A–3E.

Driver high voltage refers to the voltage (as designated at 302 of FIG. 3A) measured when the driver output 303 is stable in a logic HIGH state. In conventional drivers, this voltage 302 is usually at the positive voltage rail, but more recent designs have used lower values in an attempt to reduce power. The driver high voltage should be well above the threshold voltage to insure adequate noise margins and it should also be as close as possible to the driver low voltage to minimize bus currents, and, thereby, the adverse effects of excessive power consumption. These two conditions are usually in conflict, resulting in an opportunity to adjust the drive high voltage for optimization for particular applications.

Driver low voltage refers to the voltage (as designated at 304 of FIG. 3A) measured when the driver output 303 is stable in a logic LOW state. This voltage 304 can be, for example, that of the lower power rail or ground. The driver low voltage also has certain design considerations and trade-offs that are relevant here. Its value should be well below the threshold voltage to insure adequate noise margins and it should also be as close as possible to the driver high voltage to minimize bus currents, and thereby, the adverse effects of excessive power consumption. These two conditions are in conflict, resulting in an opportunity to adjust the drive low voltage for optimization for particular applications.

Rise time refers to the time period (as designated at 312 of FIG. 3B) between the point at which the signal 303 starts transitioning from a low voltage state to a high voltage state and the point at which this signal reaches the high voltage state. In practice the beginning and end times are measured at the transition of a defined voltage (typically, over a more or less linear portion of the rising voltage curve) in order to define these points clearly. Rise and fall times are basic components of the time from driver to receiver (defined below) and should be minimized to improve fastest bus cycle time (defined below). Unfortunately, if they become excessively fast, problems occur with undershoot, overshoot and ringing. Accordingly, here too there is an opportunity for optimization for particular applications.

Fall time refers to the time period (as designated at 314 of FIG. 3B) between the point at which a signal starts transitioning from a high voltage state to a low voltage state and the point at which this signal reaches the low value. In practice, the beginning and end times are measured at the transition of a defined voltage (i.e., over a more or less linear portion of the falling voltage curve) in order to define these points clearly. See rise time, above.

Overshoot refers to a voltage excursion (as designated at 306 of FIG. 3A) beyond the driver high voltage 302 at the end of a low-to-high voltage transition. These excursions 306 should be minimized with a properly set up bus because many receiver technologies do not tolerate them well. Typically such voltage excursions 306 are caused, for example, by an overly fast rise time (defined above) which overshoots the driver high voltage 302 due to inductance in the driver circuit.

Undershoot refers to a voltage excursion (as designated at 308 of FIG. 3A) beyond the driver low voltage 303 at the end of a high-to-low voltage transition. These excursions 308 should be minimized to facilitate resolution of the signal by receivers.

Ringing (as designated at 316 of FIG. 3C) refers to multiple voltage excursions above and below the driver high voltage or the driver low voltage, which slowly dampen out over a period of time known as "settling time" 318, until the driver high voltage or driver low voltage is obtained. Ringing is often the result of excessively fast rise or fall times, and so can be controlled by adjusting those characteristics.

Reflections refers to a propagation phenomenon that occurs, when, in response to a driven signal reflected by a stub on the bus, a reflected signal traverses the bus in the reverse direction. This voltage-reflected waveform is summed with the driven waveform, resulting in waveform distortion, often a signal having multiple "steps" and exhibiting other distortions. Multiple reflections can occur when the original reflection is again reflected at the driver. Reflections are often the result of an improperly set termination resistance, and so can be controlled by adjusting that characteristic.

Termination resistance has an optimal value that is dependent on multiple variables, including the number of terminated stubs on the bus and the impedance of the driver and the bus. Furthermore, the necessary precision in setting the value of the termination resistance depends on a number of bus signal characteristics, such as rise and fall times. These bus signal characteristics can be optimized for particular applications. Both source/driver and destination/receiver termination have an affect on them. On a bus that utilizes both termination schemes, both should be optimized.

Threshold voltage refers to the voltage having a value between the driver high voltage and the driver low voltage, above which one logic state is sensed and below which the other logic state is sensed. The threshold voltage is often slightly different for the sensing of the different states, and thus, in practice, can constitute two voltage levels, threshold high to low (as designated at 322 of FIG. 3D) and threshold low to high (as designated at 324 of FIG. 3D). The difference between these voltage levels is an "area of uncertainty", as indicated by the cross-hatched region 326 in FIG. 3D, which should be avoided at the time the state is sensed by the receiver. Threshold voltages should be optimized for the maximum margins between the driver high and low voltages and the state sensing threshold voltages. Since these margins are affected by ringing and other bus noise sources that are not symmetrical, an opportunity for optimization exists for particular applications.

Propagation time refers to the time between the leading edge of a cycle of the clock waveform (as designated at 332 of FIG. 3E) and the leading edge of the driver voltage (as designated at 334 of FIG. 3E) starting to drive a state change. Typically, these two events are measured at the transition of a voltage level. The propagation time for HIGH-to-LOW transitions ($P_{HL}$) can be different from the propagation time for LOW-to-HIGH transitions ($P_{LH}$), as measured at an arbitrary point along the voltage waveform selected based on design considerations. Propagation time is usually thought of as a negative characteristic that should be minimized. It uses up cycle time without any benefit, except, in some applications, for providing room to meet hold-time requirements. Since, in many bus applications, such a hold time restriction is readily met, propagation time is typically minimized to improve cycle time.

Cycle time (as designated at 336 of FIG. 3E) refers to the time from a point on a waveform in one cycle to the same point on the next cycle of the waveform; in other words, the time between the repeat of cycles. The inverse of cycle time is the frequency of the waveform. Example: a 100 MHz waveform has a cycle time of 10 nSec.

Fastest Bus Cycle Time refers to the fastest cycle time in which a bus can operate.

Effective Time Cycle is a concept introduced herein to represent the time from the start of the driver changing the bus state until the time that the receiver is expected to sense this state change. Effective time cycle should be contrasted with the real time cycle, which is a new name for the time from driver to receiver, and represents the total of effective time cycle and driver propagation time. Another way at looking at this concept is that the effective time cycle removes the driver propagation time from the time from driver to receiver, and only counts the time that the bus is actually in transition. The effective time cycle can be changed by adjusting the propagation time. Given a real bus cycle time, the effective time cycle is reduced as the propagation time is increased. Accordingly, for driving, reading and verifying data, stress testing by reducing the effective time cycle can be used to test the bus for errors that may arise during operations (e.g., read and write operations) or to optimize the bus parameters for particular applications.

Controlling the effective time cycle this way would be independent of the CPU clock. This is different than the traditional approach of relating the bus cycle time to the CPU clock by a gear ratio of m/n, where (m) and (n) are integers. The proposed stress testing allows the system to be tested using a separate bus stress from that imposed by the CPU or system, and provides a means to direct or target testing to a specific bus.

Minimum Time from Driver to Receiver refers to the minimum time needed for a signal to transition the bus and be captured by the receiver. The minimum time from driver to receiver can be calculated as the summation of the five following elements, representing the fastest bus cycle time:

1. Driver Propagation Time—the greater of $P_{HL}$ and $P_{LH}$
2. Rise or Fall Time—the greater of the two.
3. Settling Time—including reflection and dampening.
4. Travel time—the time needed for a signal to physically travel the length of the bus.
5. Receiver setup time—the time the signal must arrive before the data strobe. Typically a reliability margin is added to the foregoing time from driver to receiver in yielding a practical value for the bus cycle time.

In accordance with an aspect of the invention, a controllable bus driver, bus receiver, and terminator can be provided for the purpose of controlling a number of signal characteristics, such as, for example, rise and fall time, with a view to improving bus operating and signaling parameters, and overall operation and reliability of the system.

C) Bus Driver with Controllable Drive Voltage Rise/Fall Times and Limits

Figure 4:
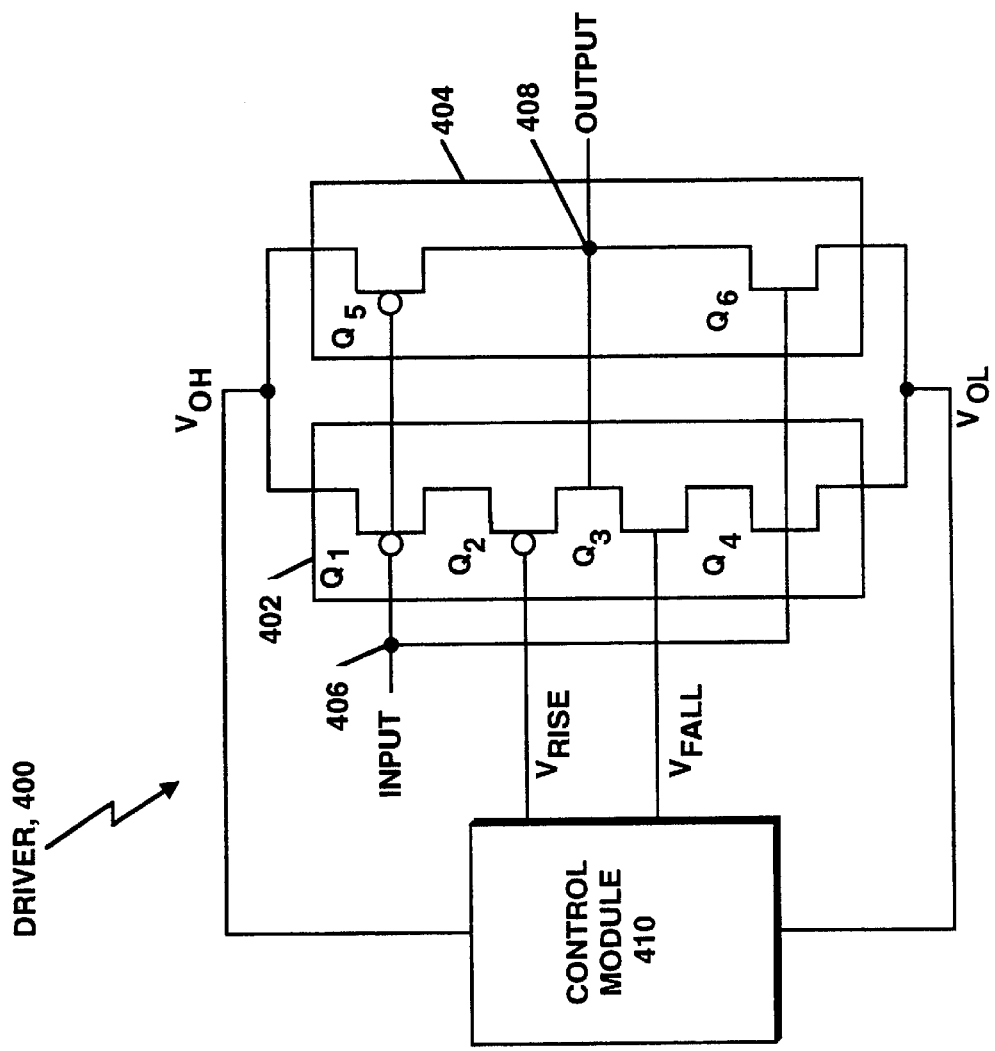
FIGS. 4, 5, and 6 are schematic views, partially in block diagram form, of alternative embodiments of the bus driver of FIG. 2.
Figure 6:
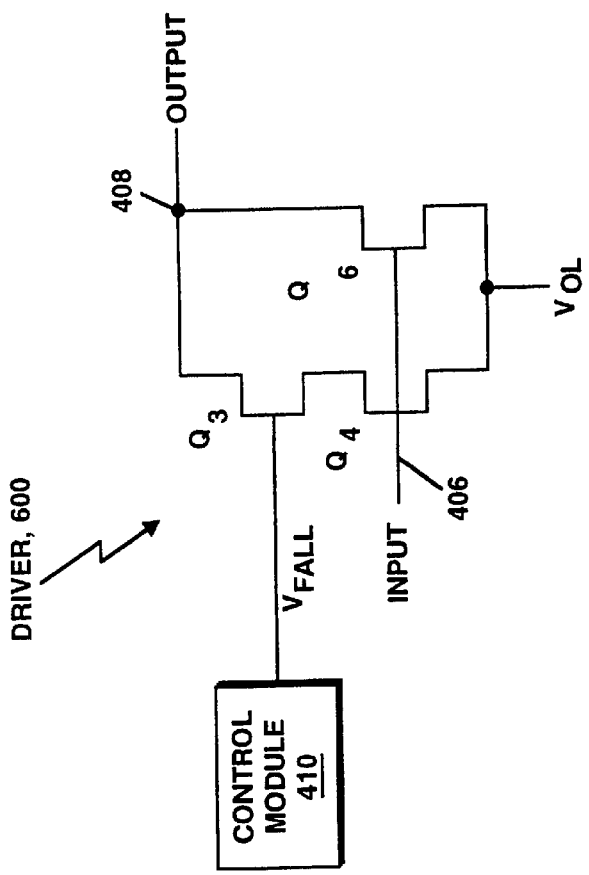
Figure 5:
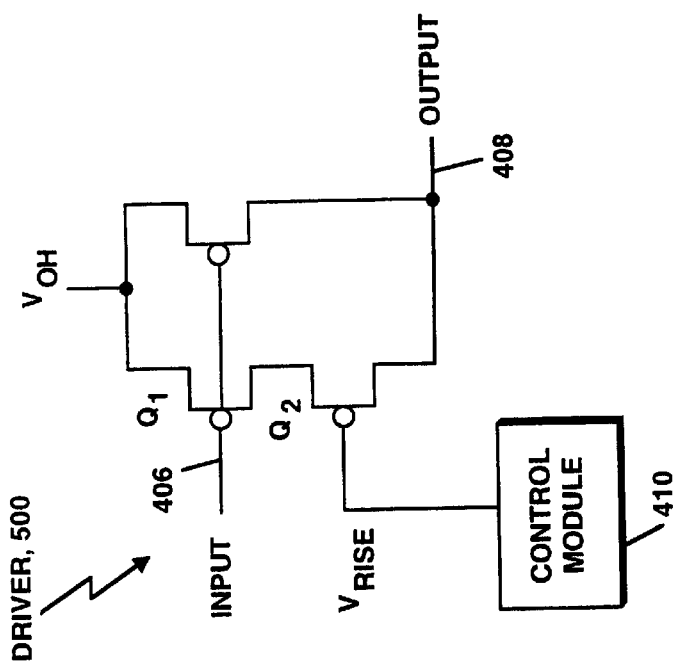

FIGS. 4, 5 and 6 show alternative implementations for the bus driver 204 of FIG. 2, designated bus drivers 400, 500, 600, respectively, which can have controlled rise and fall times as well as controlled driver voltage high and low limits. A voltage $V_{RISE}$ controls the rise time and a voltage $V_{FALL}$ controls the fall time. The driver high voltage is set by the power input voltage $V_{OH}$ and the driver low voltage is set by the power input voltage $V_{OL}$.

FIG. 4 depicts bus driver 400, which is capable of driving a bus in both directions, high and low. It is composed of two inverters 402, 404 arranged in parallel. The first inverter 402 has a stack composed of four transistors $Q_1$, $Q_2$, $Q_3$ and $Q_4$. The second inverter 404 has a stack of two transistors $Q_5$ and $Q_6$. The gates of transistors $Q_1$, $Q_4$, $Q_5$ and $Q_6$ are all driven by a common signal, Input, applied to input terminal or node 406. A voltage, Output, is tapped from a common node 408 of transistors $Q_2$, $Q_3$, $Q_5$ and $Q_6$, which is also the output terminal or node of the driver 400. During operation, when Input is low, e.g., 0 volts, the PMOS transistors $Q_1$ and $Q_5$ are on and provide a conduction path between the signal Output and $V_{OH}$. This same low voltage turns off the NMOS transistors $Q_4$ and $Q_6$ and eliminates the conduction path to $V_{OL}$. This combination results in Output going to the voltage $V_{OH}$. When Input is high, the PMOS transistors $Q_1$ and $Q_5$ are off and there is no conduction path between Output and $V_{OH}$. This same high voltage turns on the NMOS transistors $Q_4$ and $Q_6$ and provides a conduction path to $V_{OL}$. This combination results in Output going to the voltage $V_{OL}$.

The rise and fall times can be controlled separately in driver 400. The drive strength (i.e., amount of current that can be applied) of the conduction path between $V_{OH}$ and the signal Output determines the rise time at the terminal 408, and is constituted by two components, the strength of transistor $Q_5$ and the strength of transistors $Q_1$ and $Q_2$. The strength of transistor $Q_5$ is constant and is determined primarily by the size of the transistor. In parallel with this is the combination of transistors $Q_1$ and $Q_2$; the strength of this pair is limited by transistor $Q_2$ and its gate control voltage $V_{RISE}$. The lower this voltage, $V_{RISE}$, the stronger transistor $Q_2$ pulls up the Output. Thus, a lower voltage makes the rise time faster. According to an aspect of the invention, a control module 410 is provided, which can control the value of $V_{RISE}$. For example, $V_{RISE}$ can be set (e.g., factory set) to a mid-point value to achieve a pre-selected rise time, and the control module 410 can program or vary the value of $V_{RISE}$ about that midpoint to achieve a desired value for rise time, as further described below.

The strength of the conduction path between $V_{OL}$ and Output determines the fall time at Output. This strength also has two components. The strength of transistor $Q_6$ is constant and primarily determined by the size of that transistor. In parallel with this is the combination of transistors $Q_3$ and $Q_4$; the strength of this pair is limited by transistor $Q_3$ and its gate control voltage $V_{FALL}$. The higher this voltage, $V_{FALL}$, the stronger transistor $Q_3$ pulls down the signal Output. Thus a higher voltage $V_{FALL}$, makes the fall time faster. According to another aspect of the invention, the control module 410 can control the value of $V_{FALL}$. For example, $V_{FALL}$ can be set (e.g., factory set) to a mid-point value to achieve a pre-selected fall time, and the control module 410 can program or vary the value of $V_{FALL}$ about that midpoint to achieve a desired value for rise time, as further described below.

The driver high and low voltages can also be controlled separately in the driver 400. Driver high voltage is determined by $V_{OH}$, the high power supply voltage to the driver 400. According to yet another aspect of the invention, the control module 410 can control the value of $V_{OH}$ so as to provide programmable regulation of the driver high voltage. Driver low voltage is determined by $V_{OL}$, the low power supply voltage to the driver 400. The control module 410 can control the value of $V_{OL}$ so as to provide programmable regulation of the driver low voltage.

Various alternative embodiments of drivers can be utilized in the practice of the invention instead of that shown in FIG. 4. For example, FIGS. 5 and 6 show respective bus drivers 500, 600, which, as noted above, drive a bus line in only one direction instead of both directions as does driver 400. Bus driver 500 is a "drive high only" driver, while bus driver 600 is a "drive low only" driver. The drivers 500 and 600 are essentially sub-parts of the driver 400 of FIG. 4, with corresponding circuit elements and operation as described above in conjunction with FIG. 4. For convenience, analogous components have been designated with the same reference numbers.

Figure 7:
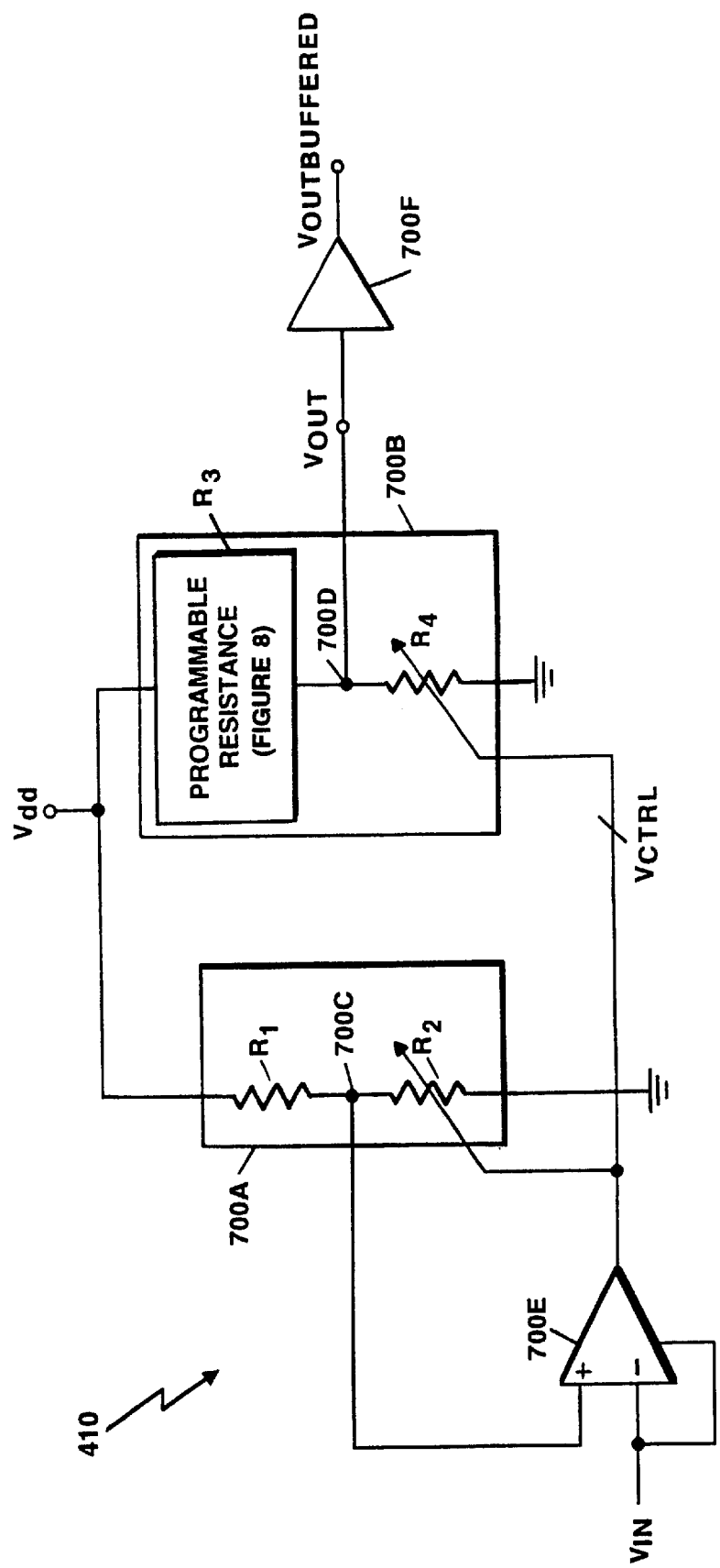
FIGS. 7 and 8 are schematic views, partially in block diagram form, of an exemplary embodiment of the control modules of FIGS. 4, 5 and 6 for adjusting at least one bus parameters in accordance with an application of the invention.
Figure 8:
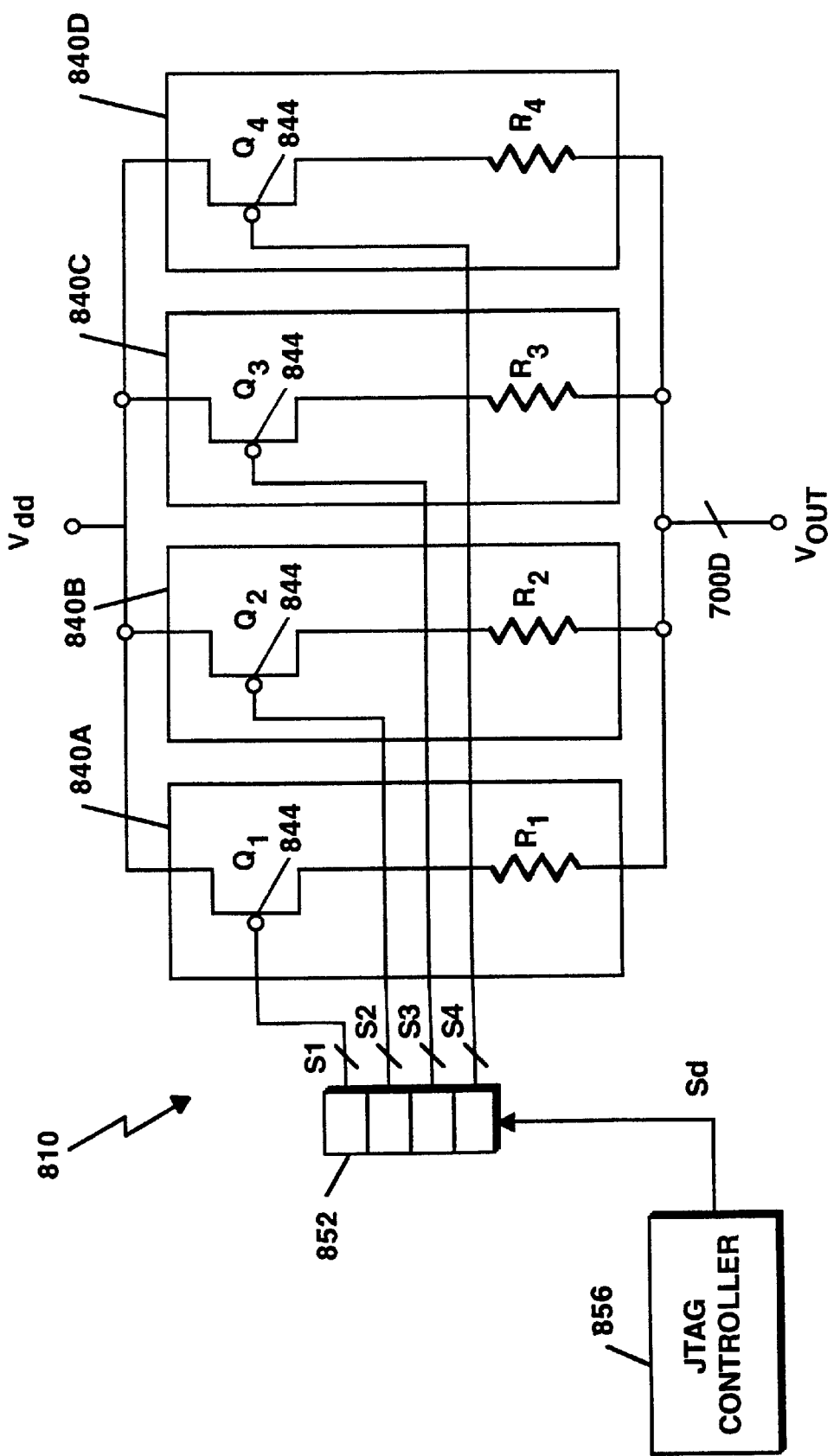

With renewed reference to the driver 400 of FIG. 4, FIGS. 7 and 8 will now be described. FIG. 7 and 8 shows an implementation of the control module 410 for providing programmable control of any one of the voltages $V_{RISE}$, $V_{FALL}$, $V_{OH}$ and $V_{OL}$. In order to control all of these voltages, the illustrated implementation can be replicated, with the control voltage $V_{OUT}$ from the replicated circuitry applied to the appropriate terminal that is shown in FIG. 4 as receiving $V_{RISE}$, $V_{FALL}$, $V_{OH}$ or $V_{OL}$.

FIG. 7 shows an embodiment of the control module 410, having two voltage dividers 700A, 700B. Voltage divider 700A includes a resistor $R_1$ and a variable resistor $R_2$, interconnected by a common node 700C. Voltage divider 700B includes a programmable resistance $R_3$ and a variable resistor $R_4$, interconnected by a common node 700D. A power supply voltage $V_{dd}$ is applied to $R_1$ and $R_3$, and $R_2$ and $R_4$ are connected to ground. The control module 410 also employs an operational amplifier 700E. An input voltage, $V_{in}$, is applied to a first input terminal of the operational amplifier 700E, whose second input terminal is tied to node 700C. The operational amplifier's output, $V_{ctrl}$, is applied to the resistance adjustment terminals of variable resistors $R_2$ and $R_4$. $V_{ctrl}$ is generated such that the voltage at node 700C is at the same level as $V_{in}$. The control module's output, $V_{out}$, is tapped at node 700D, and in some applications can be buffered by amplifier 700F so as to form a $V_{outbuffered}$ signal capable of sourcing and sinking current while preventing voltage drops and thus avoiding the effects of changes in current loading. During operation, $V_{ctrl}$ causes resistors $R_2$ and $R_4$ to assume the same resistance value. Accordingly, the relationship between resistance values of $R_1$ and $R_3$ determines the output voltage $V_{out}$. Since the resistance of $R_1$ is preferably fixed, the resistance of $R_3$ determines $V_{out}$. According to an aspect of the invention, the resistance of $R_3$ is programmable, responsive to a digital signal $S_d$ (described below), so as to provide a controllable value for $V_{out}$. As noted above, $V_{out}$ is applied to the driver 400 of FIG. 4 as $V_{RISE}$, $V_{FALL}$, $V_{OH}$ or $V_{OL}$. Consequently, any of these electrical characteristics can be regulated, and thus the bus operating or signaling parameters that depend on them adjusted.

FIG. 8 shows a programmable resistance circuitry 810 for implementing the programmable resistance $R_3$ of FIG. 8. The resistance circuitry 810 includes a plurality of resistance cells 840A–D. The number of cells can vary with the application, e.g., depending on the desired degree or range of resistance control. Each resistance cell 840A–D includes a controllable, variable resistor $R_1$, $R_2$, etc. and a transistor switch $Q_1$, $Q_2$, etc. $V_{dd}$ is applied to the cells 740A–D as the positive rail for the resistance circuitry 810, and the other end of the cells are tied to node 700D, from which $V_{out}$ is tapped.

The state of the transistor switches $Q_1$, $Q_2$, etc. determines whether the corresponding resistance cells 840A–D are connected into the resistance circuit or open circuited. For these purposes, the source of each transistor switch 844 is connected to $V_{dd}$, and the drain is connected to the associated resistor $R_1$, $R_2$, etc. of the same cell containing the transistor switch. The gate of each transistor switch 844 is connected to control signal lines, which carry digital selection signals $S_1$, $S_2$, ... $S_4$. The selection signals cause the transistor switches $Q_1$, ..., $Q_4$ to conduct or cease conducting, i.e., turn "on" and "off", depending on whether the selection signals are HIGH or LOW. Accordingly, the resistance circuitry 810 is designed to selectively place a greater or lesser number of cells, and thus a greater or lesser number of resistors $R_1$, ..., $R_4$, in parallel, responsive to the individual selection signals. The sizes of the variable resistors $R_1$, ..., $R_4$ can be all equal, or, alternatively, can be different so as to provide discrete resistance value steps of respectively the same size or different sizes as more or less of the variable resistors are switched on or off in the resistance circuitry 810. The selection signals $S_1$, $S_2$, ..., $S_4$ are provided to the gates of transistor switches $Q_1$, ..., $Q_4$ via a JTAG register 852 from a JTAG controller 856, which applies the selection signals to the register 852 as voltages comprising a JTAG signal $S_d$. The JTAG controller 856 and register 852 can be implemented in compliance with the "JTAG Specification, as set forth in IEEE 1149.1—1990, Standard Test Access Port and Boundary-Scan Architecture ("JTAG Spec"), which is incorporated herein by reference, and available from IEEE, 3 Park Avenue, $17^{th}$ Floor, N.Y., N.Y., 10016-5997, USA. The JTAG controller 856 is responsive to a digital signal generated, e.g., in response to a computer-executed program, which is implemented in compliance with the JTAG Spec. Accordingly, the JTAG controller 856 controls the overall resistance of the programmable resistance circuitry 810 by turning "on" (making active) individual resistance cells 740A–D, individually and separately, via the programmable selection signals $S_1$, $S_2$, ..., $S_4$ and the transistor switches $Q_1$, ..., $Q_4$.

During operation, the JTAG controller 856 establishes an initial internal resistance value for resistance $R_3$, for example, by causing approximately half of the resistance cells 840A–D, (e.g., in terms of resistance value or number of cells) to be switched on. For example, in the illustrated embodiment, cells 840A and 840B can be switched on, while cells 840C and 840D can be switched off. With those initial conditions, in order to control $V_{RISE}$, $V_{outbuffered}$ is applied to driver 400 as $V_{RISE}$, and produces a first value for the rise time. To modify that first value, the JTAG controller 856 can cause $S_d$ to connect a greater or lesser number of resistance cells 840A–D into the resistance circuitry 810, causing $V_{RISE}$ to vary, either increasing or decreasing, in discrete steps corresponding to the differences in the resistance values through a range determined by respectively the minimum and maximum values of the programmable resistance. Similarly, in order to control $V_{FALL}$, $V_{outbuffered}$ is applied to driver 400 as $V_{FALL}$, and, under the initial conditions, produces a first value for the fall time which can appropriately be adjusted. To control $V_{OH}$ or $V_{OL}$, and thus to establish driver high or low voltage limit, $V_{outbuffered}$ is applied to driver 400 as $V_{OH}$ or $V_{OL}$, respectively, and, under the initial conditions, produces a first value for the respective drive high or low voltage limits, which can appropriately be adjusted, as described herein.

Accordingly, in summary, the JTAG controller 856 can cause the rise and fall times to be modified by changing the number of active resistance cells 840A–D. Increasing the number of active resistance cells 840A–D causes the internal resistance to decrease. The rise and fall times and drive high and low voltage limits thus can be changed in discrete steps, corresponding to the contribution of each resistance cell to total internal resistance, within a range about the first value. It should be evident that to control separately each of these signal characteristics, the circuitry of FIGS. 7A and 7B can be replicated and the $V_{outbuffered}$ from each can be applied to control a different one of these signal characteristics.

Figure 10A:
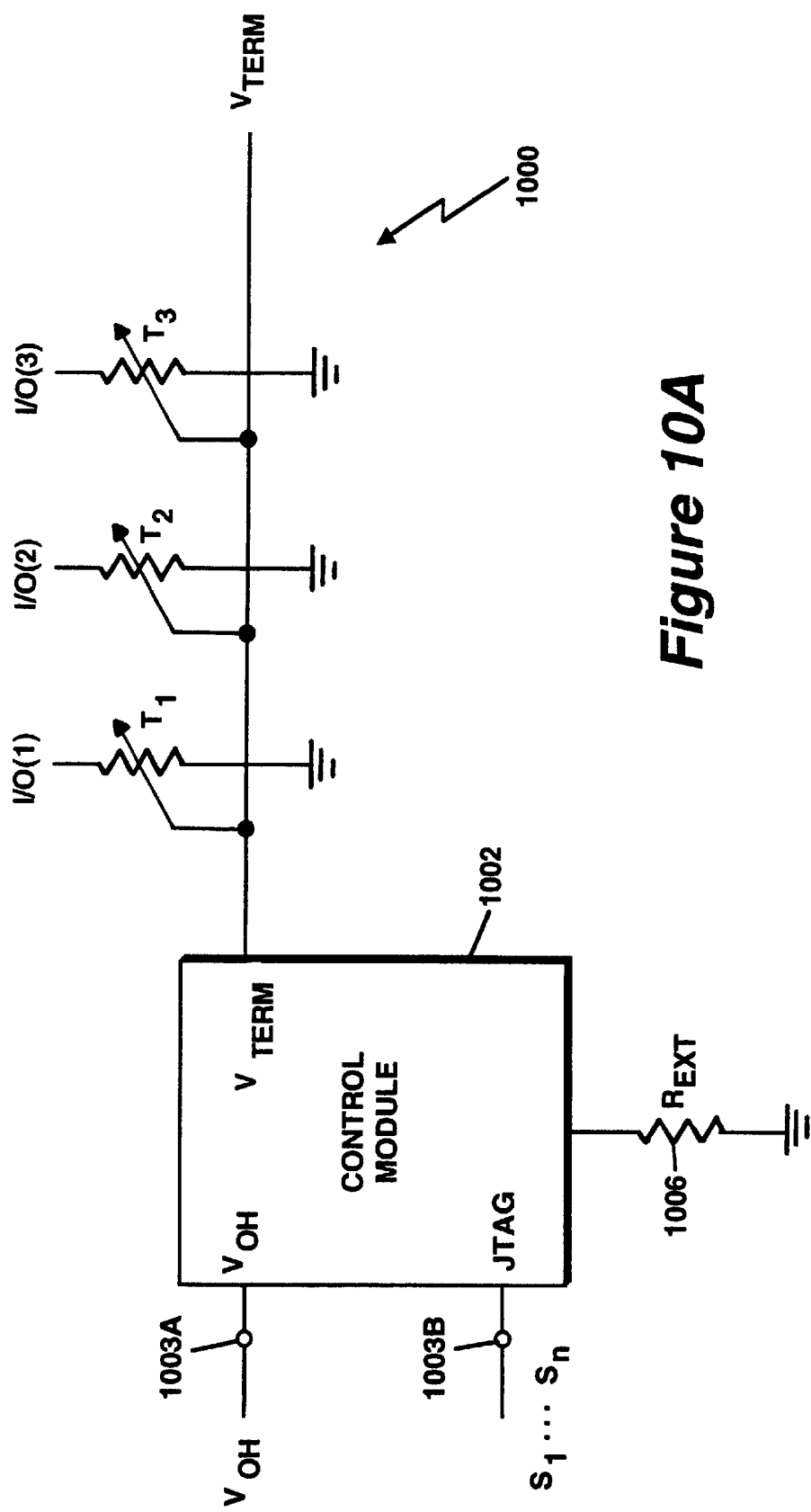
FIG. 10A is a schematic view, partially in block diagram form, of an embodiment of the terminator of FIG. 2.

Returning to FIG. 7, the implementations for resistors $R_1$, $R_2$ and $R_4$ deserve further description. Resistor $R_1$ preferably is implemented as shown in FIG. 8, without the need for the JTAG controller 856 and register 852, and with the $S_1$, ... $S_4$ lines hard wired so that, e.g., only transistor switches 840A and 840B are switched on. In such an implementation, the node designated 700D in FIG. 8 would become node 700C of FIG. 7. Thus, the resistance value of $R_1$ will match that of the initial value, as described above, of programmable resistance $R_3$. Resistors $R_2$ and $R_4$ are preferably implemented as instances of the resistance circuit shown in FIG. 10C (described below) with the DrvVar node corresponding to respective nodes 700C and 700D for resistors $R_2$ and $R_4$, and $V_{ss}$ being grounded. The resistance values of each of $R_2$ and $R_4$ being set by JTAG select signals as shown in FIG. 10A so that the voltage at node 700C is equal to voltage Vin. Both resistors $R_2$ and $R_4$ of FIG. 7 receive the same control voltage, $V_{ctrl}$, as noted above, and should have the same resistance value. Accordingly, the implementations as described herein for resistors $R_1$, ..., $R_4$ of FIG. 7 will assure substantially identical voltage dividers 700A and 700B, with the voltage $V_{out}$ adjustable by changing the $S_d$ signals for the resistance of programmable resistance $R_3$.

The just-described implementation of the control module 402 (as shown in FIGS. 7 and 8 for use as part of the driver of FIG. 4) can also be used to implement the control module for the drivers 500, 600 of FIGS. 5 and 6. With renewed reference to those figures, where drivers 500, 600 drive in one direction only, the control module 410 regulate the appropriate voltage $V_{OH}$ or $V_{OL}$ to control the driver high or low voltage, respectively. The terminator 202 (FIG. 2) can be tied to a programmable source, (as described below) to provide the high voltage for the driver low only driver 600, and can be used to pull the bus line down to provide the low voltage in the drive high only driver 500.

D) Bus Receiver with Controllable Threshold Voltage

Figure 9:
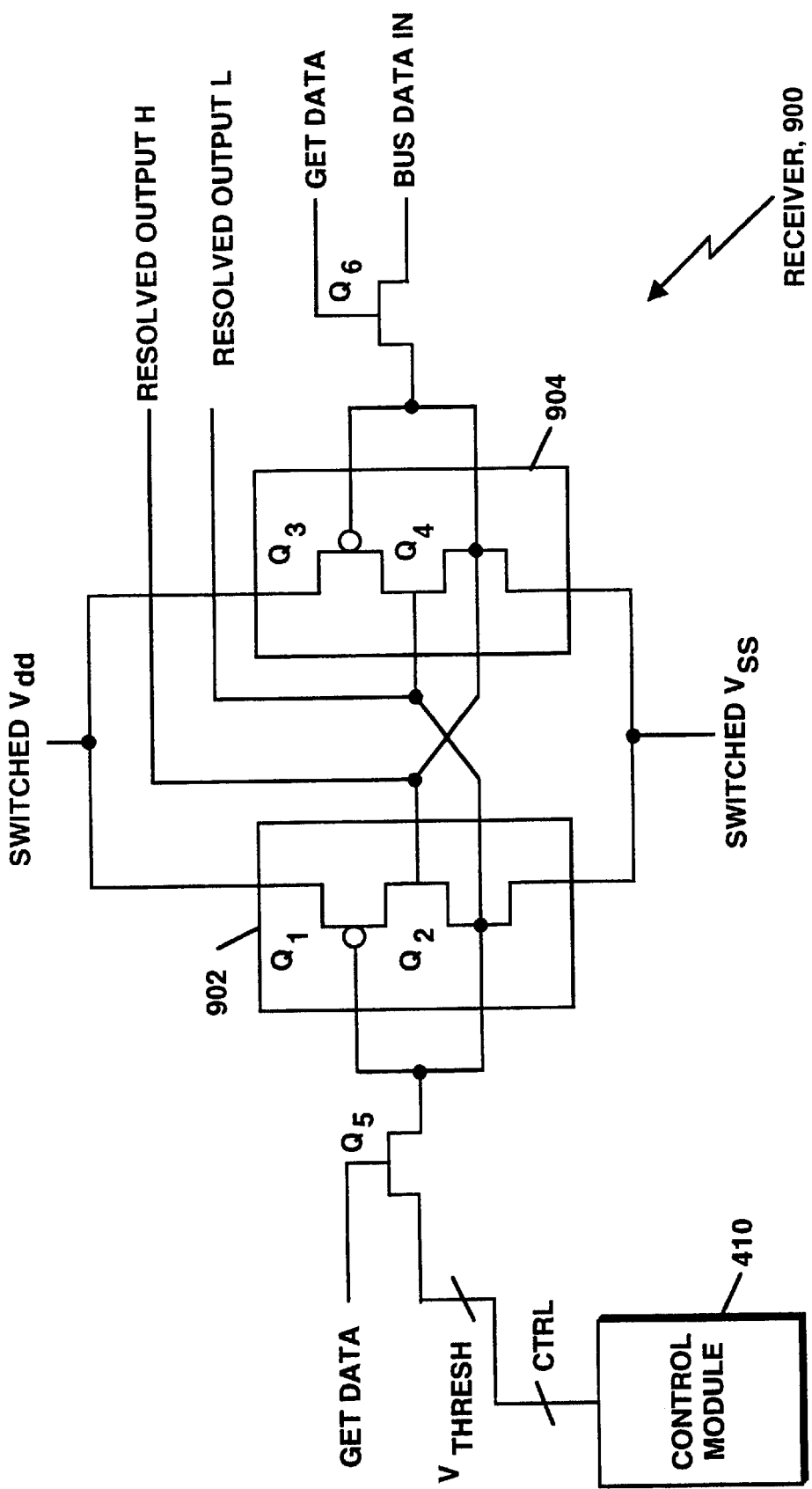
FIG. 9 is a schematic view, partially in block diagram form, of an embodiment of the bus receiver of FIG. 2.

FIG. 9 shows a bus receiver 900 implemented as a sense amplifier circuit. The receiver 900 receives two input voltages, $V_{THRESH}$ and BusDataIn, and resolves the outputs to a unique state depending upon which of the two inputs is higher than the other. The receiver 900 has two cross-coupled inverters 902 and 904. The first is a stack composed of transistors $Q_1$ and $Q_2$. The second is a stack composed of transistors $Q_3$ and $Q_4$. The input to the first inverter 902 is connected to the signal $V_{THRESH}$ through the NMOS transistor $Q_5$. The input to the second inverter 904 is connected to the signal BusDataIn through the NMOS transistor $Q_6$. The input of the first inverter 902 is further connected to the output of the second inverter 904, ResolvedOutputL. The input of the second inverter 904 is further connected to the output of the first inverter 902, ResolvedOutputH. Both of the inverters 902 and 904 are connected to power by the signals SwitchedV$_{ss}$ and SwitchedV$_{dd}$. The transistors $Q_5$ and $Q_6$ act as switches to connect the inputs to $V_{THRESH}$ and BusDataIn, respectively. The connections are made when the gates of the transistors $Q_5$ and $Q_6$ are at a high voltage due to the signal GetData. When the signal GetData is low, the connections are open.

The various signals illustrated in FIG. 9 can be described as follows: $V_{THRESH}$ is a programmed voltage provided to the receiver 900, and acts as a threshold voltage. It effectively determines the switch point from "one" to "zero". When BusDataIn is higher than $V_{THRESH}$, the signal ResolvedOutputH goes high and ResolvedOutputL goes low. This is normally thought of as resolving to the "one" state. When BusDataIn is lower than $V_{THRESH}$, the signal ResolvedOutputH goes low and ResolvedOutputL goes high. This is normally thought of as resolving to the "zero" state. BusDataIn is the data input that is compared against $V_{THRESH}$ to determine the resolved state. GetData controls the input transistors $Q_5$ and $Q_6$. When this signal is high, the inverter inputs get their data through these transistors from $V_{THRESH}$ and BusDataIn. When the signal is low, these inputs are not connected to $V_{THRESH}$ and BusDataIn. If SwitchedV$_{ss}$ and SwitchedV$_{dd}$ are off, the inverter transistors gates act as capacitors and hold their value. When SwitchedV$_{ss}$ and SwitchedV$_{dd}$ are on, the inverter transistors gates are driven by the output of the opposite inverter.

SwitchedV$_{dd}$ supplies high voltage power source to the inverters 902 and 904 so they can act as a resolver when this voltage is on. When this voltage SwitchedV$_{dd}$ is off, it floats and the inverters are not powered. SwitchedV$_{ss}$ supplies low voltage power source to the inverters so they can act as a resolver when this voltage is on. When voltage SwitchedV$_{ss}$ off, it floats and the inverters are not powered. ResolvedOutputH is an output of the receiver 700. It goes high when BusDataIn is higher than $V_{THRESH}$ and it goes low if BusDataIn is lower than $V_{THRESH}$. ResolvedOutputL is an output of the receiver 900. It goes low when BusDataIn is higher than $V_{THRESH}$ and it goes high if BusDataIn is lower than $V_{THRESH}$.

The receiver 900 resolves to the correct state by using the following timing sequence. The power signals, SwitchedV$_{ss}$ and SwitchedV$_{dd}$, start in the off state. That is, they do not provide any power to the inverters. The signal GetData is low so the inputs are not connected to the inverters. Then, the following sequence of events occur: The signal GetData transitions to a high state. This connects $V_{THRESH}$ and BusDataIn to the inputs of their respective inverters. These signals charge the gates of the input transistors to their respective voltage values. A finite time later GetData transitions to a low. This disconnects the inputs $V_{THRESH}$ and BusDataIn. The gates of the inverter input transistors act as capacitors and hold their charge. The inverters are not powered so they do not affect the charge. A finite time later the signals SwitchedV$_{ss}$ and SwitchedV$_{dd}$ are turned on. This powers up the inverters. The inverters each have a voltage on their inputs and the inverter output tries to move in the direction these voltages determine. The direction depends on where the voltage is in relation to the intrinsic threshold of the inverters. As they start to move they move the other input because of the cross coupled outputs to inputs. If both inverters move in the same direction the one further from its intrinsic threshold moves faster and wins the cross coupled battle. The two outputs move toward the opposite rails as they resolve to the proper state. After resolution is completed the output are stored into an output stage (not shown). This is used to save the output during the next cycle and provide the receiver output. After storage into the output stage the inverter power is turned off and the cycle is repeated for the next cycle of receive data.

The resolution threshold is determined by the value of $V_{THRESH}$. This voltage can be programmable using the control module 700 of FIG. 7 and the programmable circuitry of FIG. 8, where the voltage $V_{outbuffered}$ is applied as the voltage $V_{THRESH}$, and thus provides a programmable threshold receiver.

E) Bus Terminator with Controllable Resistance.

FIG. 10A depicts a voltage-controlled terminator or termination resistance circuit 1000. The terminator 1000 has a control module 1002 and a plurality of terminator resistances $T_1$, $T_2$, $T_3$ for terminating respective I/O lines I/O(1), I/O(2), I/O(3), which can include, for example, the Output line 408 of the driver 400 of FIG. 4 and the BusDataIn line of the receiver 900 of FIG. 9. The number of such I/O lines so terminated can be increased or decreased according to the needs of a particular application; accordingly, the selection herein of three such I/O lines (numbered 1, 2 and 3) is purely for convenience in illustration and description. The terminator resistances $T_1$, $T_2$, $T_e$ have programmably adjustable resistance values dependent on the voltage $V_{TERM}$. The control module 1002 receives a voltage $V_{ctrl}$ at an input terminal 1003A and, responsive to a digital select signal $S_1$, . . . $S_n$ applied, for example, at a JTAG terminal 1003B, regulates the terminator resistance values of terminator resistance I/O(1), I/O(2), I/O(3). Preferably, the terminator resistance values are programmably adjustable within a pre-selected range about a central value (i.e., a value falling within the range, though not necessarily at its mid-point) determined by an external resistor $R_{EXT}$ 1006. Moreover, as will be described shortly, the terminator resistances $T_1$, $T_2$, $T_e$ can be adjusted as a group in an "aggregate" or "bank" adjustment, or each can be adjusted separately in an "individual" adjustment, or both bank and individual adjustments can be implemented in particular applications.

Figure 10B:
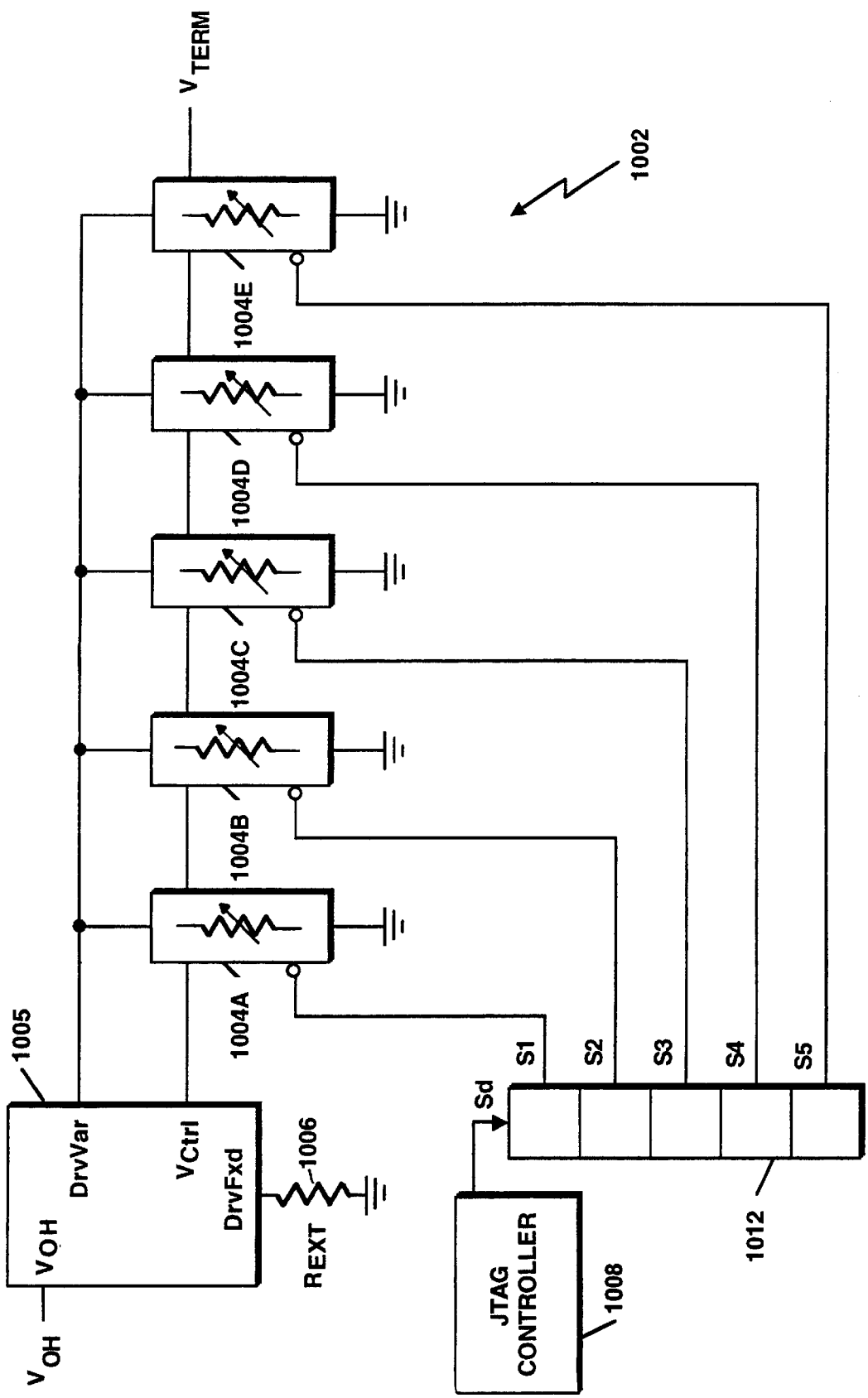
FIG. 10B is a schematic view, partially in block diagram form, of an embodiment of the control module of FIG. 10A.

FIG. 10B shows an exemplary implementation of the control module 1002. As depicted, control module 1002 includes a control module 1005 and a plurality of programmable resistance cells 1004A–E, whose collective resistance is set programmably by select signals $S_d$ ($S_1$, $S_2$, . . . , $S_5$)generated by a JTAG controller 1008 and applied via a JTAG register 1012. The resistance cells 1006A–E are connected in parallel and, responsive to the select signals $S_d$, are either active or inactive, as defined below. The control module 1005 is designed to generate both a DrvFxd voltage applied to the external resistor $R_{ext}$ 1006 and a DrvVar voltage applied to the resistance cells 1004A–E. When generated as described herein, those voltages will cause the resistance of resistance cells 1004A–E to equal that of the external resistor $R_{ext}$ at a first set of values of the select signals $S_d$, when a selected number of cells are active, and can be varied about that resistance by changing the values of the select signals and thus rendering active a different number of cells. The number of active resistance cells 1004A–E will determine the overall value of the resistance of the resistance cells 1004A–E. For example, when $S_1$, $S_2$ and $S_3$ are selected (e.g. have low values), resistance cells 1004A–C are active and the values of the terminator resistors $T_1$, $T_2$, $T_3$ will match external resistor $R_{EXT}$. As more resistance cells 1004D–E are turned on, i.e., made active, via select signals $S_4$ and/or $S_5$ assuming low values, the values of the terminator resistance $T_1$, $T_2$, $T_3$ rises. On the other hand, as more resistance cells 1004D–E are turned off, i.e., made inactive, via select signals $S_1$, $S_2$ and/or $S_3$ assuming high values, the values of the terminator resistances $T_1$, $T_2$, $T_3$ falls.

Figure 10C:
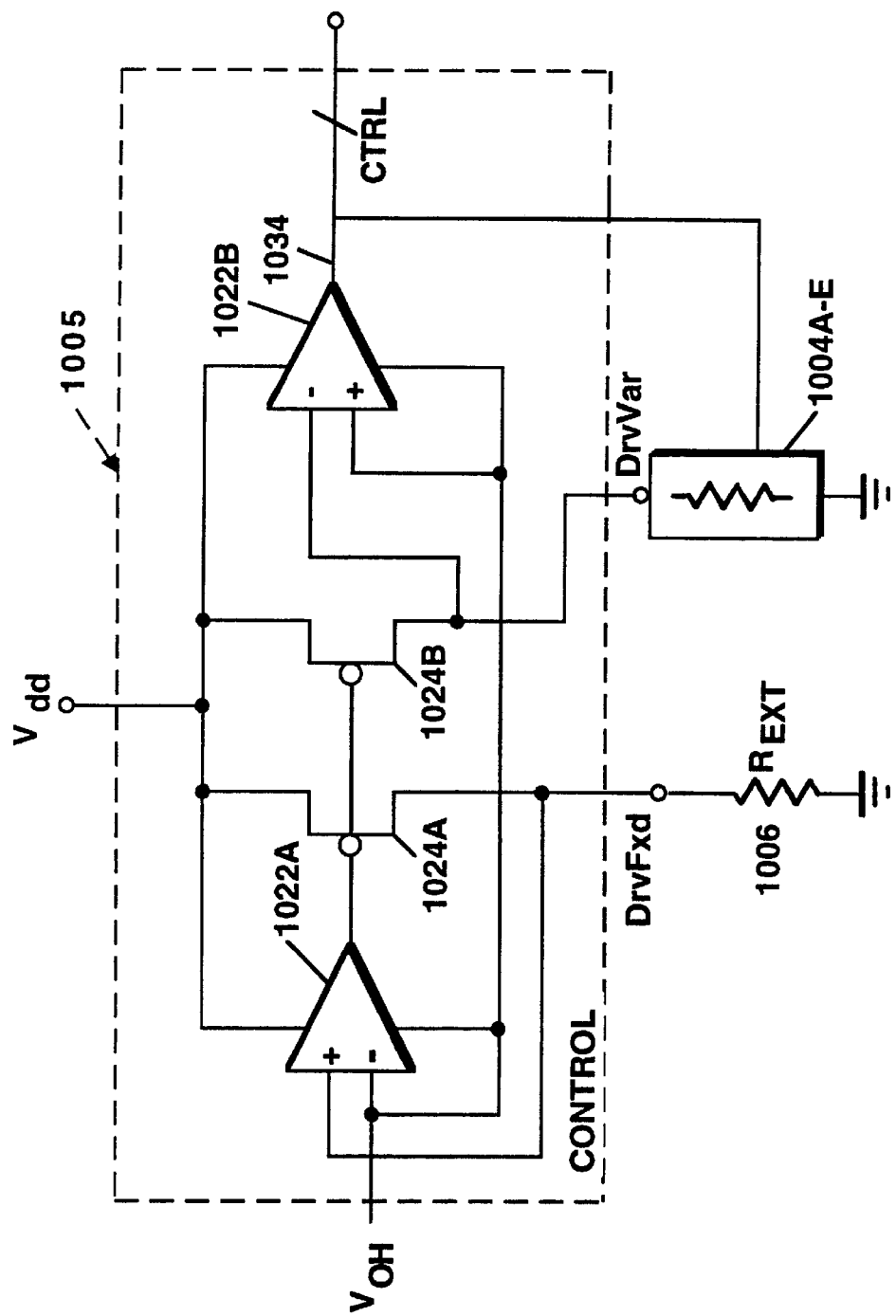
FIG. 10C is a schematic view, partially in block diagram form, of an embodiment of the control module of FIG. 10B.

FIG. 10C shows an embodiment for the control module 1005, which generates the drive voltage DrvFxd for an external resistor $R_{EXT}$ 1006 and the drive voltage DrvVar for the resistance cells 1004A–E, as well as a control signal $V_{ctrl}$ for use in setting the resistance values of the individual resistance cells 1004A–E. The external resistor 1006 is, for example, a discrete device, provided separately from an integrated circuit (IC) on which all or most of the rest of the control module 1002 is preferably implemented, hence the descriptor "external." The resistance cells 1004A–E are depicted collectively as a single variable resistance 1004, for ease in illustration. The control module 1002 has a pair of operational amplifiers 1022A, 1022B, and identical transistor constant current sources 1024A, 1024B used to generate DrvFxd and DrvVar. The control module 1002 receives a supply voltage $V_{OH}$ at an inverting (−) terminal of the operational amplifier 1022A and at the non-inverting terminal of operational amplifier 1022B. The non-inverting (+) input of the operational amplifier 1022A, and the inverting (−) input of operational amplifier 1022B are coupled to receive voltages DrvFxd and DrvVar, respectively, as feedback signals. The output of the operational amplifier 1022A is applied to the control gates of the transistors 1024A, 1024B. The transistors 1024A, 1024B have sources connected to $V_{dd}$, the power supply voltage, have drains connected to the non-inverting (+) terminal of operational amplifier 1022A and the inverting (−) terminal of operational amplifier 1022B, and provide the output signals DrvFxd and DrvVar to output terminals 1030, 1032, respectively. $V_{ctrl}$ is provided from the output terminal 1034 of operational amplifier 1022B.

During operation, the operational amplifier 1028A supplies the gates of both transistors 1024A and 1024B with the same voltage. This slows current through both resistor 1006 and resistance 1004, and, via the feedback, adjusts the gate drives until the voltage level of DrvFxd is $V_{OH}$. The operational amplifier 1028B adjusts the level of $V_{ctrl}$ via feedback until the voltage level of DrvVar is at $V_{OH}$. At this point, the external resistor 1006 and the programmable resistance 1004 match. The voltage $V_{ctrl}$ can be passed to other instances of variable resistance 1004. More specifically, $V_{ctrl}$ is passed to each of the resistance cells 1004A–E of FIG. 10A.

Figure 10D:
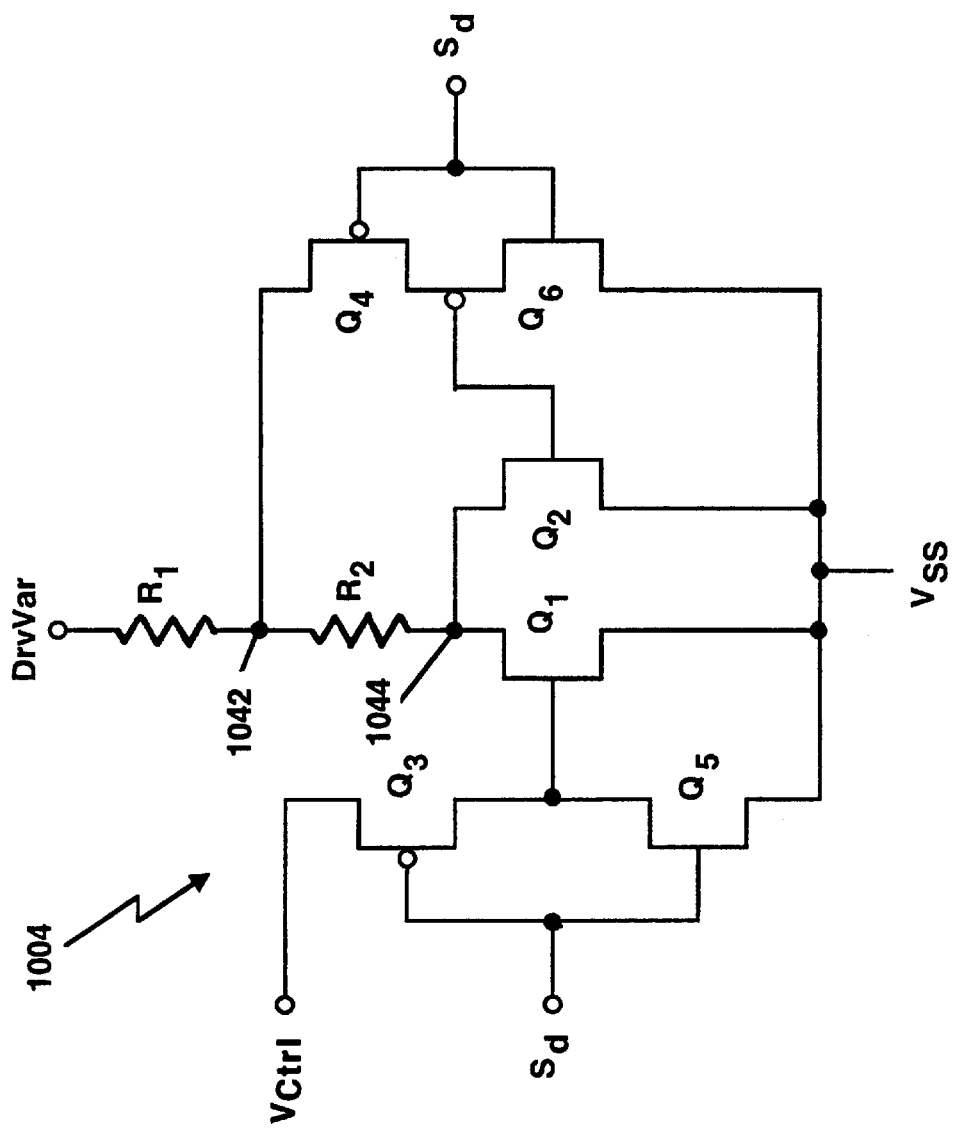
FIG. 10D is a schematic view, partially in block diagram form, of an embodiment of the programmable resistance of FIG. 10B.

FIG. 10D shows an illustrative embodiment for a representative one of the programmable resistance cells 1004A–E of FIG. 10A. Each resistance cell 1004A–E has a resistor $R_1$ in series with a resistor $R_2$ in series with the parallel configuration of transistors $Q_1$ and $Q_2$, with the resistors $R_1$, $R_2$ and transistors $Q_1$ and $Q_2$ are connected between DrvVar and $V_{ss}$. The gates of transistors $Q_1$ and $Q_2$ are each connected to a gate control circuit for switching on or off the respective transistors. When transistors $Q_1$ and Q2 switched on, the resistance cell 1004A–E is active, and when switched off, the resistance cell 1004A–E is inactive. The gate control circuit for transistor $Q_1$ includes transistors $Q_3$ and $Q_5$ connected in series between $V_{ctrl}$ and $V_{ss}$, with a select signal $S_d$ applied to their gates as a switching signal. The gate control circuit for transistor $Q_2$ includes transistors $Q_4$ and $Q_6$ connected in series between a node 1042 connecting resistors $R_1$ and $R_2$ and $V_{ss}$, with the same select signal $S_d$ applied to their gates as a switching signal. The resistance through transistor $Q_1$ is dependent upon the value of $V_{ctrl}$, such that the resistance increases as the value of $V_{ctrl}$ decreases. This resistance is not linear for all values of voltage DrvVar. Given a value of $V_{ctrl}$, the resistance goes lower as DrvVar goes lower because the effective resistance is related to the voltage between the gate and source of transistor $Q_1$, that is, the voltage at node 1044. As the source of transistor $Q_1$ goes more positive than its gate, conduction decreases so the resistance increases. Since $V_{ctrl}$ is constant and DrvVar lower, the source to gate voltage decreases and eventually goes negative. This nonlinear relationship is compensated by transistor $Q_2$, which is biased to provide the opposite relationship between DrvVar voltage and resistance than that of transistor $Q_1$. As the voltage level of DrvVar decreases, the voltage across resistor $R_2$ decreases. This results in the source to gate voltage of transistor $Q_2$ decreasing, causing its conduction to increase while its resistance decreases. The relative sizes of the two transistors $Q_1$, $Q_2$ are selected to complement each other and result in effective compensation of the voltage-to-resistance relationship across a desirable range in values of $V_{ctrl}$. Furthermore, when the select signal $S_d$ is in a low state, the PMOS transistors $Q_3$ and $Q_4$ conduct, and, consequently, transistors $Q_1$ and $Q_2$ conduct. Under those conditions, the resistance cell 1004A–E is active. When the select signal $S_d$ is in a high state, the NMOS transistors $Q_5$ and $Q_6$ conduct and ground the gates of transistors $Q_1$ and $Q_2$, causing these transistors to stop conducting and disconnect the resistors $R_1$ and $R_2$ from the circuit. In other words, under that latter condition, the path from DrvVar to $V_{ss}$ is open and the cell is inactive.

Accordingly, the termination resistance is determined by the select signals $S_d$, which are programmable using JTAG technology in the control module 1002. The JTAG controller 1056 establishes an initial internal resistance value, for example, by causing approximately half of the resistance cells 1004A–D (e.g., in terms of resistance value or number of cells) to be switched on. For example, in the illustrated embodiment, cells 1004A and 1004B can be switched on, while cells 1004C and 1004D can be switched off. Under those initial conditions, the internal feedback voltages DrvFxd, DrvVar modify voltage CTRL, thus changing the internal resistance of resistance circuitry 1004, until the voltages DrvFxd, DrvVar produced by the identical transistor constant current sources 1024A, 1024B cause the same voltage drop across the internal resistance (established by the active resistance cells 1004A–D) as that across the external resistance $R_{ext}$. This happens when the internal and external resistances are equal, and voltages DrvFxd, DrvVar, and CTRL are equal.

Returning to FIG. 10A, the terminator resistances $T_1$, $T_2$, $T_3$ can be implemented, for example, in any of a variety of embodiments depending on the application. For example, the terminator resistances $T_1$, $T_2$, $T_3$ can each be implemented as shown in FIG. 10B, but without a control module analogous to module 1005. Thus, replicas of that circuit can be used to implement both the control module 1002 of FIG. 10B as well as the individual terminator resistances $T_1$, $T_2$, $T_3$ of FIG. 10A. Of course, different select signals $S_d$ will need to be applied to control the value of each terminator resistance. Moreover, for purposes of implementing the terminator resistances $T_1$, $T_2$, $T_3$, lines I/O(1), I/O(2) and I/O(3) would replace the line on which DrvVar is applied in FIG. 10B.

Figure 10E:
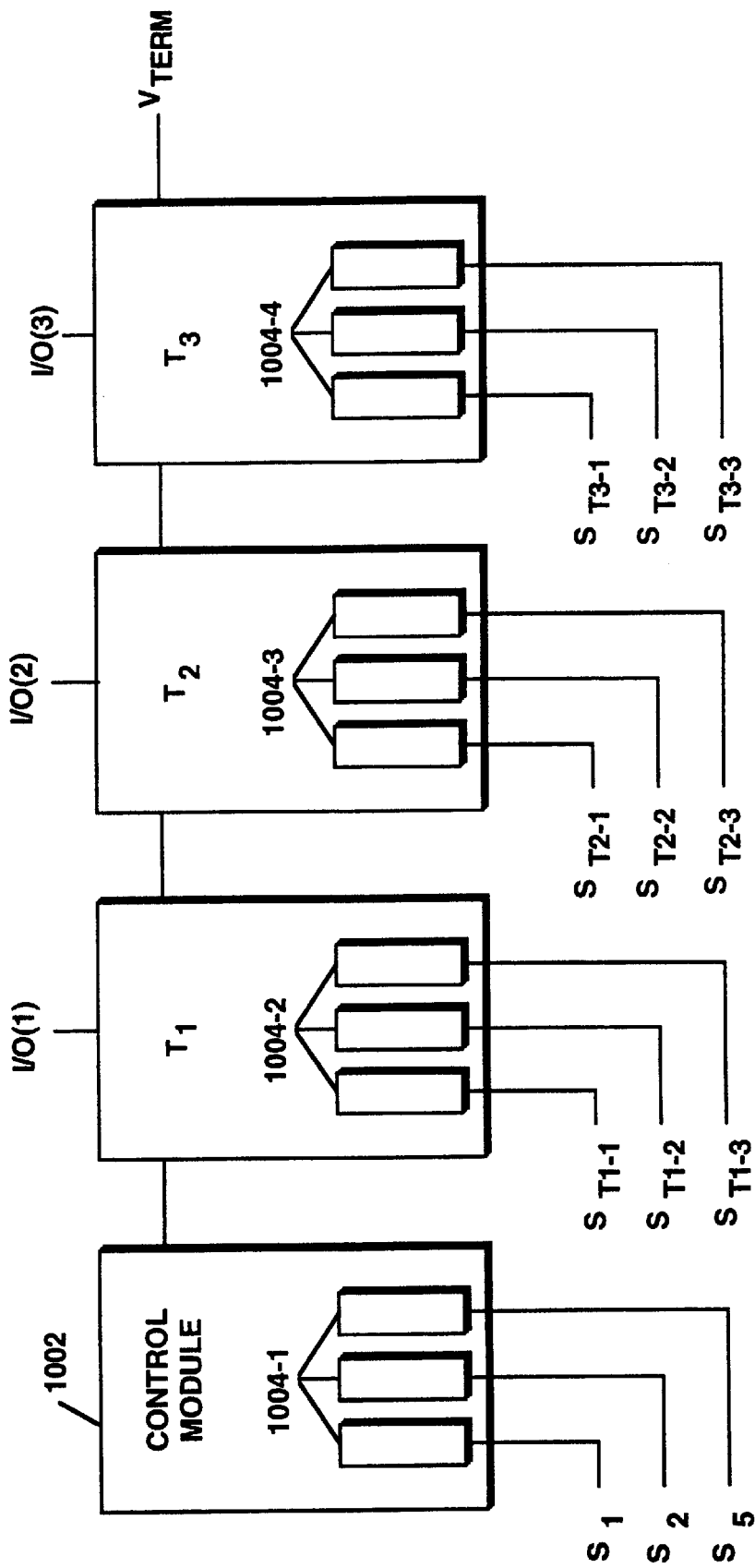
FIG. 10E is a schematic view, partially in block diagram form, of an embodiment of the terminator of FIG. 10A, two levels of control for both bank and individual adjustment of termination resistance levels.

FIG. 10E illustrates the resulting control aspects of a terminator 1000 having both bank and individual adjustment capability for the line terminations. Bank adjustment of the terminator resistances $T_1$, $T_2$, $T_3$ is achieved by select signals $S_1$, $S_2$, ... $S_5$ controlling the number of resistance cells 1004-1 active in the control module 1002. Individual adjustment of the terminator resistances $T_1$, $T_2$, $T_3$ can be achieved by adjusting the number of resistance cells 1004-2, 1004-3, 1004-4 active in the particular terminator resistance $T_1$, $T_2$, $T_3$ whose value is being adjusted. For example, terminator resistance $T_1$ can be individually adjusted programmably using select signals $S_{T1-1}$, ... $S_{T1-3}$ to render active a selected number of resistance cells 1004-2. Similarly, terminator resistance $T_2$ can be individually adjusted programmably using select signals $S_{T2-1}$, ..., $S_{T2-3}$ to render active a selected number of resistance cells 1004-3, and terminator resistance $T_3$ can be individually adjusted programmably using select signals $S_{T3-1}$, ... $S_{T3-3}$ to render active a selected number of resistance cells 1004-4. The select signals $S_{T1-1}$, $S_{T2-1}$, $S_{T3-1}$, ..., $S_{T3-3}$ can be applied to the corresponding device (i.e., control module 1002 or terminator resistance $T_1$, $T_2$, $T_3$) by the JTAG controller 1008 (FIG. 10B), which generates those signals under program (e.g., software) control.

Alternatively, in applications in which individual adjustments of the terminator resistances are not required, each terminator resistance can be implemented as shown in FIG. 10D, but, e.g., without the select circuitry of transistors $Q_3$, $Q_4$, $Q_5$, and $Q_6$. In such an implementation, $V_{CTRL}$ is applied to the gate of transistor $Q_1$, and resistor $R_1$ is connected to the I/O line rather than DrvVar as illustrated. Such an arrangement permits the terminator resistances $T_1$, $T_2$, $T_3$ to be bank adjusted programmably. For a given $V_{CTRL}$, the resistance from I/O to $V_{SS}$ would be set to equal e.g., the resistance from DrvVar to $V_{SS}$ (ground) in FIG. 10A when three of the select signals are enabled.

F) Bus Driver with Controllable Propagation Time

A measure of bus performance is the bus transfer rate, which specifies the rate at which address, control, and data are transferred on the bus. Several difficulties are encountered when improving bus performance. A characteristic called bus cycle time gives an indication of the speed of a bus. For a synchronous bus, a bus cycle can be viewed as that period of time required to complete a transfer on the bus before a new transfer can begin. (In synchronous buses, all transfers are synchronized to a common timing signal referred to as a clock signal). This minimum period determines the maximum clock rate. In general, the minimum cycle time for a synchronous bus is related to (a) phase accuracy (or temporal shift) in the clock (generally referred to as clock skew), (b) propagation delay from an asserting edge of the clock to the point of time that the data appears at the output of the driver connected to the bus, and (c) delay associated with driving the bus. The delay associated with driving the bus includes two components. The first one is the propagation delay through the bus driver and the second is the period of time necessary to have the bus settle. For an asynchronous bus, similar considerations are present to determine a minimum cycle time. (In asychronous buses, hand-shaking signals are used to transfer information as quickly as possible.) For the asynchronous bus, the minimum cycle time is related to noise in the handshaking signals, propagation delay from an asserted edge of the handshaking signals to the period of time that the data appears at the driver connected to the bus, and delay associated with driving the bus.

For purposes hereof, the focus will be on synchronous buses, though aspects of the invention can be practiced as well with asynchronous buses. Also, for these purposes, propagation time for a voltage output signal of a bus driver can be considered as the time from when the driver is presented data until it drives the bus to transmit that data. This time is part of the effective bus cycle time and is usually minimized; however, it may be possible to shorten effectively the bus cycle by increasing the propagation time.

Figure 11:
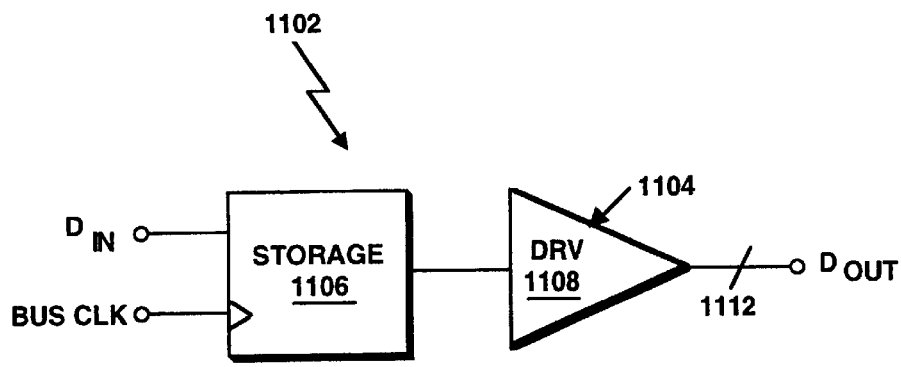
FIG. 11 is a block diagram of a conventional bus driver module.

FIG. 11 shows a conventional bus driver module 1100 as including an input stage 1102 that acquires the data being transmitted and an output stage 1104 that presents the output data to the bus. The first stage 1102 includes a storage element 1106, in which the data is stored at BusClk time, and the output stage 1104 includes a driver circuit 1108 for sending the data out as $D_{out}$ on driven line 1112.

Figure 12:
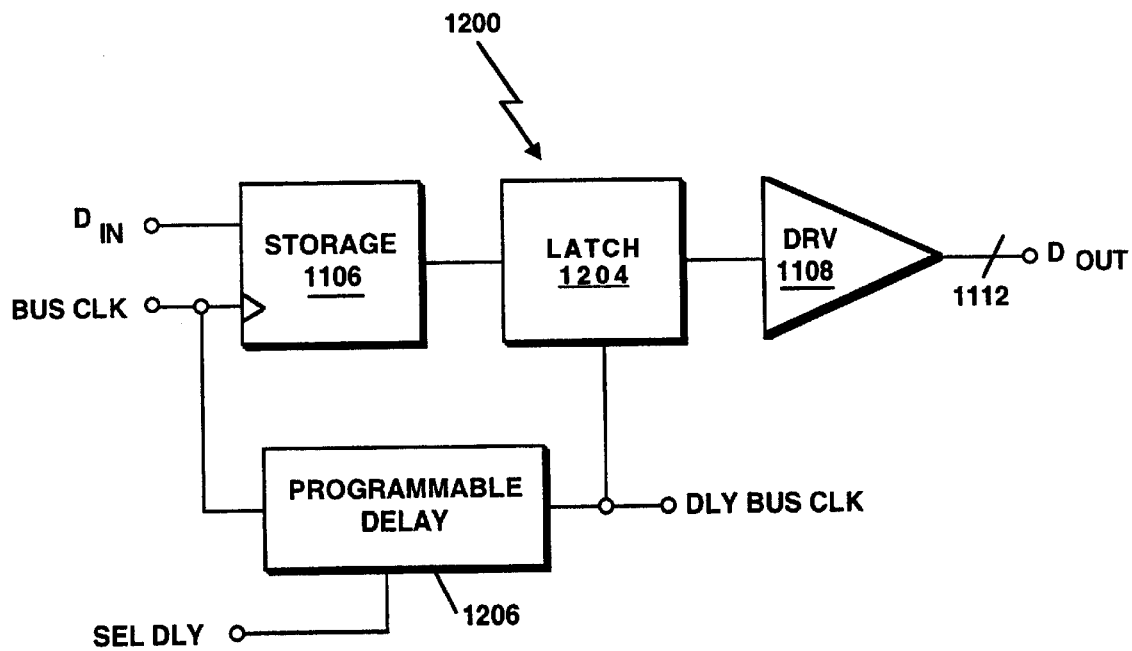
FIGS. 12 and 13 are block diagrams of a bus driver module in accordance with an alternative embodiment of another aspect of the invention regarding programmable propagation time.

FIG. 12 shows a bus driver module 1200 in accordance with an embodiment of an aspect of the invention. FIG. 12 differs from FIG. 11 in that it includes a transparent latch 1204 disposed between the storage element 1106 and the driver 1108. The latch 1204 is opened to allow data to be latched therein by a delayed bus clock, and retains the previously latched data until the latch 1204 is opened again by the delayed bus clock. Thus, the latch 1204 acquires the data from the storage element 1106, latches it for a selected period of time, preferably a programmable time so as to introduce a controllable delay, and then passes it to the driver 1108. Accordingly, the bus driver module 1200, by latching the data on BusClk and presenting it to $D_{out}$ after the programmable delay, effectively implements a programmable propagation time.

Figure 13:
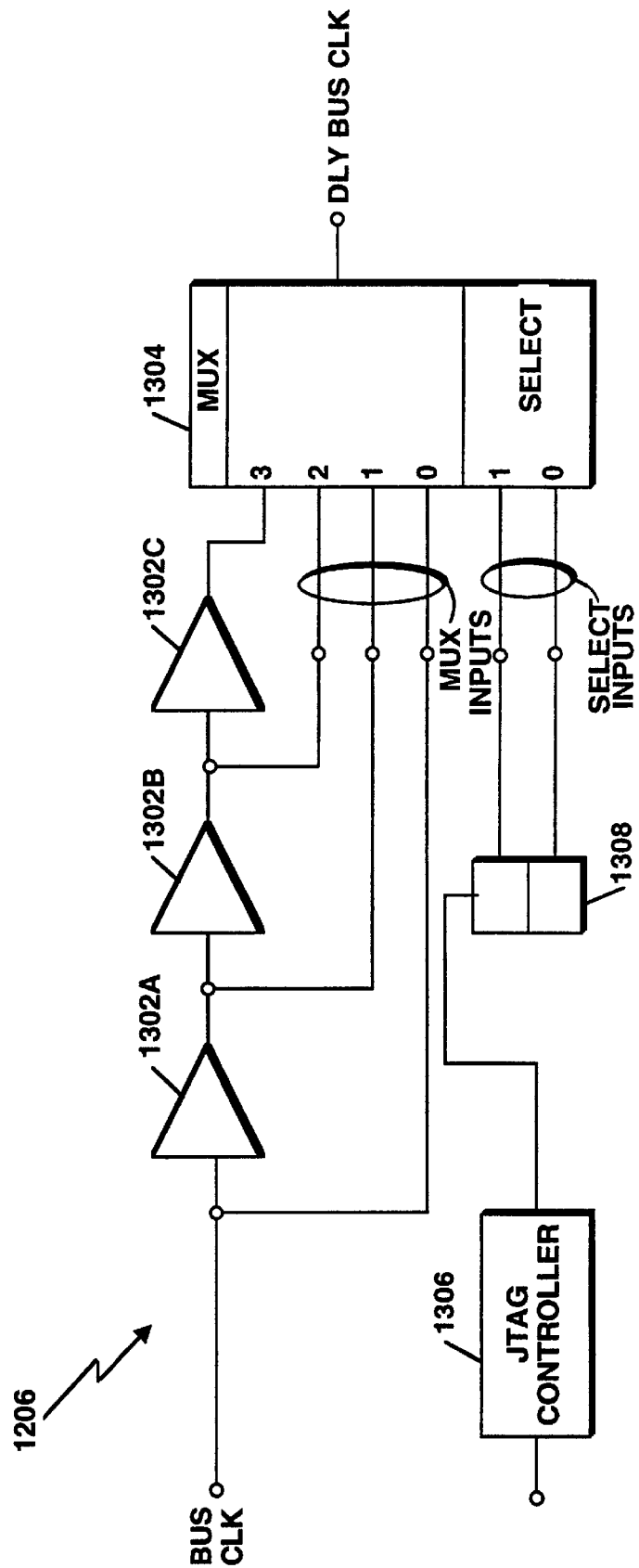

FIG. 13 shows an implementation of the programmable delay 1206 of FIG. 12. The programmable delay includes a chain of serially connected amplifiers 1302A–C, a muliplexer (MUX) 1304, and a JTAG control 1306. The amplifiers 1302A–C are preferably non-inverting, and are characterized by a finite propagation time between their input terminals and output terminals. The bus clock signal BusClk is applied to the input terminal of amplifier 1302A, which introduces a delay in the clock signal equal to its characteristic input-output propagation time. The resulting signal is passed to amplifier 1302B, which introduces another delay, and passes the resulting signal to amplifier 1302C where yet another delay is introduced (The number of amplifiers can be varied for particular applications. The clock signal BusClk is provided as an input 0 of the MUX 1304, and the output terminals of amplifiers 1302A–C are connected individually to respective inputs 1–3 of the MUX 1304. The JTAG controller, responsive to a control signal, produces a digital select signal $S_d$, e.g., which is provided via JTAG register 1308 to select terminals of the MUX 1304. As illustrated, the select signal $S_d$ can be two bits in length that represent and select any one of the four inputs 0–3, which is to be passed to the output of the MUX 1304. Thus, if the select signal is set, for example, at a value of 00, the input 0 can be passed through the MUX, which means that the output of the MUX is essentially the undelayed BusClk. Otherwise, for another value of the select signal, one or another of the delayed outputs of the amplifiers 1302A–C will be passed by the MUX onto its output terminal, with the delay being longer in direct relation to the number of amplifiers through which the BusClk signal must pass. The output of the MUX is a signal called DLYBUSCLK, and is provided as a clock to the latch 1204.

Accordingly, the programmable delay 1206 can introduce delay in discrete steps under programmable control so as to vary the delay in the clock that controls storage in storage unit 1204. As the propagation delay is increased, propagation time increases. As propagation time increases, the effective time cycle is reduced. Reducing the effective time cycle is an effective way to stress test a bus for data transfer errors or to optimize bus parameters for particular applications.

Alternatively, the programmable delay can be introduced into the data signal itself, by substituting the programmable delay of FIG. 13 for the storage element 1104 in the driver 1200 of FIG. 12. With this arrangement, the data signal is applied to amplifier 1302A (instead of Bus CLK), and the output of MUX 1304 is a delayed data signal (instead of DlyBusClk), which is applied to the driver circuit 1104. With this arrangement, it is not necessary to delay the BusClk signal, per FIG. 12. A further alternative to the approach of FIG. 13 for delaying the clock so as to form a DlyBusClk signal uses a phase lock loop and frequency multiplier arrangement.

G) Computer Systems

Figure 14:
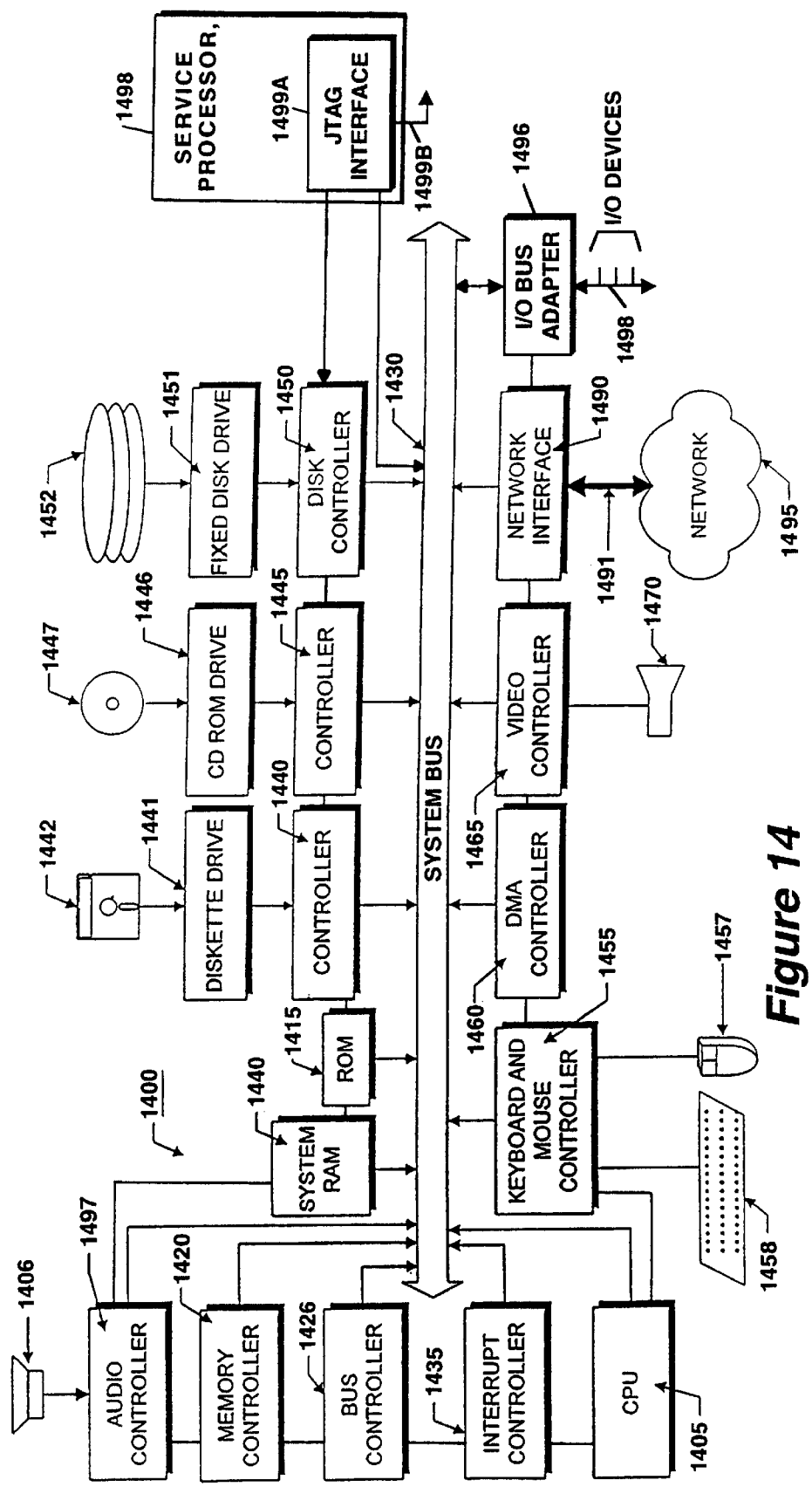
FIG. 14 is a block diagram of an illustrative architecture of a single-processor computer system in which the invention can be practiced.
Figure 15:
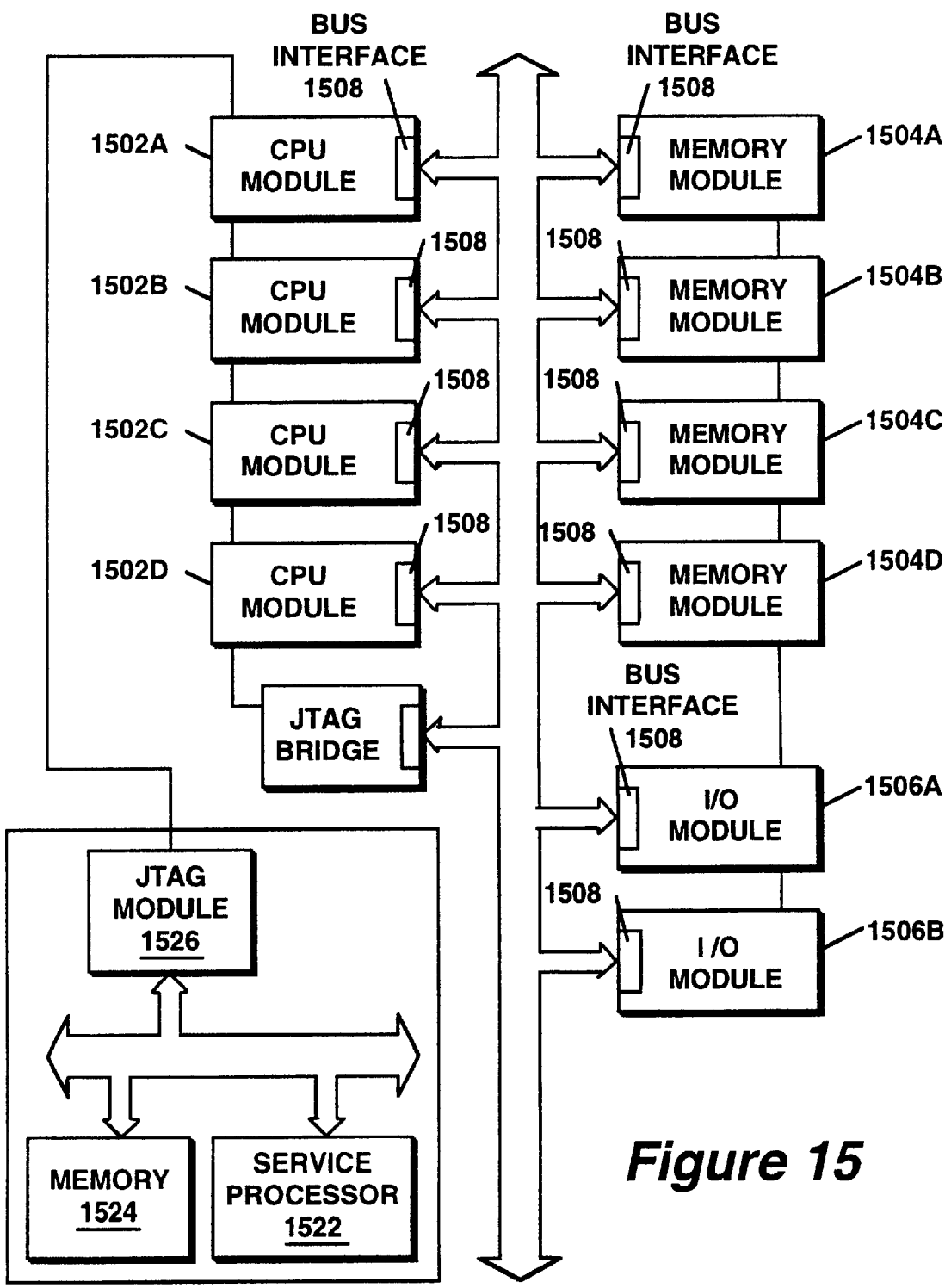
FIG. 15 is a block diagram of an illustrative architecture of an alternative, multiprocessor computer system in which the invention can be practiced.

As noted above, the electronic system 100 of FIG. 1 can be implemented as a computer system. FIGS. 14 and 15 illustrate types of computer systems in which the invention can be implemented. It should be understood at the outset that the invention can be implemented in any of a great variety of computer architectures, including both single-processor and multiprocessor designs. In addition, the invention can be practiced in other forms of intelligent devices, having system or other buses, for which the invention can be advantageously employed. Such other intelligent devices may include network devices, such as bridges and gateways, and communication devices.

Moreover, the single-processor computer system 1400 shown in FIG. 14 and the multiprocessor computer system 1500 shown in FIG. 15 are discussed only for illustrative purposes, and their specific layout and design should not be considered a limitation of the invention. Although the description below may refer to terms commonly used in describing particular computer systems, the described concepts apply equally to other computer systems, including systems having architectures that are dissimilar to that shown in FIGS. 14 and 15.

In FIG. 14, the computer system 1400 includes a central processing unit (CPU) 1405, which may include a conventional microprocessor, random access memory (RAM) 1410 for temporary storage of information, and read only memory (ROM) 1415 for permanent storage of information. A memory controller 1420 is provided for controlling system RAM 1410. A bus controller 1425 is provided for controlling system bus 1430, and an interrupt controller 1435 is used for receiving and processing various interrupt signals from the other system components.

Mass storage may be provided by diskette 1442, CD-ROM 1447, or hard disk 1452. Data and software may be exchanged with computer system 1400 via removable media, such as diskette 1442 and CD-ROM 1447. Diskette 1442 is insertable into diskette drive 1441, which is connected to system bus 1430 by controller 1440. Similarly, CD-ROM 1447 is insertable into CD-ROM drive 1446, which is connected to system bus 1430 by controller 1445. Finally, the hard disk 1452 is part of a fixed disk drive 1451, which is connected to system bus 1430 by controller 1450.

User input to and output from the computer system 1400 may be provided by a number of devices collectively constituting an I/O subsystem. For example, a keyboard 1456 and a mouse 1457 may be connected to a system bus 1430 by keyboard and mouse controller 1455. An audio transducer 1496, which may act as both a microphone and a speaker, is connected to bus 1430 by audio controller 1497. It should be obvious to those reasonably skilled in the art that other input devices, such as a pen and/or tablet and a microphone for voice input, may be connected to computer system 1400 through bus 1430 and an appropriate controller. DMA controller 1460 is provided for performing direct memory access to system RAM 1410. A visual display is generated by a video controller 1465, which controls video display 1470. Where the computer system 1400 is a server, the foregoing I/O devices may be part of the system only when needed for system monitoring, upgrading or servicing.

Computer system 1400 also includes a network adapter 1490 that allows the computer system 1400 to be interconnected to a network 1495 via a bus 1491. The network 1495, which may be a local area network (LAN), a wide area network (WAN), or the Internet, may utilize general-purpose communication lines that interconnect multiple network devices.

Moreover, the computer system 1400 can include an I/O bus adapter 1496 connected between the system bus 1430 and an I/O bus 1498 for communication between components connected to the system bus and one or more I/O devices connected to the I/O bus. The I/O bus adapter 1496 typically is a node on each of the buses 1430, 1498, and serves to convert signals on one of the buses intended for devices on the other into signals having the appropriate protocol and addressing for their destination.

The system bus 1430, network bus 1491, and I/O bus 1498 are collectively referred to herein for convenience as the "computer buses", a term intended to a encompass not just these named buses, but also any and all buses implementable in a computer system, including switched network interconnects. The computer buses each include address, control, and data lines for communication via the particular bus protocols with which each complies. Each of the devices connected to any of the computer buses includes a bus interface (as described above, though not separately shown in this figure) for driving and receiving signals over the bus in accordance with its bus protocol. Additionally, the computer system 1400 can include a service processor 1498. The service processor 1498 has a JTAG interface 1499A, which communicates over a dedicated JTAG link 1499B with other devices connected thereto.

Computer system 1400 generally is controlled and coordinated by operating system software, such as the SOLARIS™ operating system (available from Sun Microsystems, Palo Alto, Calif., USA). Among other computer system control functions, the operating system controls allocation of system resources and performs tasks such as process scheduling, memory management, networking and I/O services.

In FIG. 15, the multiprocessor computer system 1500 is shown as including four CPU modules 1502A–D, four memory modules 1504A–D, and two I/O modules 1506A–B. The exact number of each of these devices is used merely for purposes of illustration and other computer system implementations may include a greater or lesser number of these devices. Each of the modules 1502A–D, 1504A–D, and 1506A–B includes a bus interface 1508 for connecting their respective module to a system bus 1510. The system bus 1510 can be, for example, implemented as a network containing a point-to-point switching fabric. The interfaces 1508 contain logic for driving and receiving signals over the system bus 1510 in accordance with its bus protocol, preferably implemented as an integrated circuit, (IC). Moreover, each module 1502A–D, 1504A–D, and 1506A–B can be implemented as a separate application specific integrated circuit ("ASIC") containing the interface 1508. FIG. 15 also shows a service processor module 1520 for managing service related activities for the computer system 1500. The service processor module includes a service processor 1522 for executing programs, such as software, a memory 1524 for storing data and programs, and a JTAG module 1526, which can implement the JTAG interfaces 1506 for example, under the control of the service processor 1522. The service processor module 1520 can be implemented as a computer system, having the components discussed above in conjunction with FIG. 14.

A software implementation of components of the above-described embodiment may comprise computer instructions and routines either fixed on a tangible medium, such as a computer-readable media, e.g. the diskette 1442, CD-ROM 1447, ROM 1415, or fixed disk 1452 of FIG. 14, or transmittable via a modem or other interface device, such as communications adapter 1490 connected to the network 1495 over a medium 1491. Medium 1491 can be either a tangible medium, including but not limited to optical or hard-wire communications lines, or may be implemented with wireless techniques, including but not limited to microwave, infrared or other transmission techniques. It may also be the Internet. A series of computer instructions embodies all or part of the functionality previously described herein with respect to the invention. Those skilled in the art will appreciate that such computer instructions can be written in a number of programming languages for use with many computer architectures or operating systems. Further, such instructions may be stored using any memory technology, present or future, including, but not limited to, semiconductor, magnetic, optical or other memory devices, or transmitted using any communications technology, present or future, including but not limited to optical, infrared, microwave, or other transmission technologies. It is contemplated that such a computer program product may be distributed as a removable media with accompanying printed or electronic documentation, e.g., shrink wrapped software, pre-loaded with a computer system, e.g., on system ROM or fixed disk, or distributed from a server or electronic bulletin board over a network, e.g., the Internet or World Wide Web.

Though an exemplary embodiment of the invention has been disclosed, it will be apparent to those skilled in the art that various changes and modifications can be made which will achieve some of the advantages of the invention without departing from the spirit and scope of the invention. For example, the invention can be implemented by those reasonably skilled in the art in the bus drivers, receivers, and terminators shown and described in the above-referenced patents instead of those described herein-above. Moreover, it will be obvious to those reasonably skilled in the art that other components performing the same functions may be suitably substituted. Further, the methods of the invention may be achieved in either all software implementations, using the appropriate processor instructions, or in hybrid implementations that utilize a combination of hardware logic and software logic to achieve the same results, or in hardware and firmware implementations. Further, aspects such as the size of memory, the specific configuration of logic and/or instructions utilized to achieve a particular function, as well as other modifications to the disclosed embodiments and the inventive concept are intended to be covered by the appended claims.

What is claimed is:

1. Apparatus for converting a digital control signal generated by a test and control circuit to an analog voltage that adjusts an electrical characteristic of a computer bus interface, which is determinative, at least in part, of at least one bus operating and signaling parameter, the apparatus comprising:
 a first voltage divider connected across power and ground having in serial connection a first fixed-value resistor to a first node to a second resistor with an adjustable value;
 a second voltage divider connected across power and ground having a serial connection of a third resistor, having a programmable resistance value and thermal and electrical characteristics substantially similar to the first resistor, to a second node to a fourth resistor having an adjustable value wherein the voltage at the second node is the analog control voltage;

a controller that is responsive to the digital control signal for programming the resistance value of the third resistor; and an adjustment circuit that simultaneously adjusts the second resistor and the fourth resistor so that the first node is held at a predetermined input voltage value.

2. The apparatus in accordance with claim 1, wherein the test and control circuit includes a processor for executing a program for setting the digital control signal so as to cause adjustment of the electrical characteristic.

3. The apparatus in accordance with claim 1, wherein the third resistor comprises a programmable, variable resistance circuit having a plurality of resistance cells (a) each characterized by a resistance value, and (b) and each including a switch, responsive to a switching signal, for individually connecting the resistance cells into the resistance circuit and thereby individually rendering the resistance cells active.

4. The apparatus in accordance with claim 3, wherein each switch comprises a transistor switching circuit responsive to a corresponding one of the switching signals; and the apparatus further comprises a controller, responsive to the digital control signal, for generating the switching signals.

5. The apparatus in accordance with claim 3, wherein each of the resistance cells includes a variable resistance; a number of the resistance cells are rendered active by the switching signal; and the control voltage varies in relation to the number of active resistance cells.

6. The apparatus in accordance with claim 1, wherein the bus interface includes a bus driver for driving one of the bus lines with a driver voltage output signal, and wherein the at least one bus parameter includes one or more of the parameters comprising rise and fall times of the voltage output signal, a high voltage limit for the voltage output signal, a low voltage limit for the voltage output signal, and a propagation time of the voltage output signal.

7. The apparatus in accordance with claim 1, wherein the bus interface includes a bus receiver for receiving bus signals from one of the bus lines, and wherein the at least one bus operating and signaling parameter includes a threshold voltage for the bus receiver.

8. The apparatus in accordance with claim 1, wherein the bus interface includes a bus terminator for terminating the bus lines, and wherein the at least one bus operating and signaling parameter includes termination resistance for each of the bus lines.

9. A method for converting a digital control signal generated by a test and control circuit to an analog voltage that adjusts an electrical characteristic of a computer bus interface, which is determinative, at least in part, of at least one bus operating and signaling parameter, the method comprising:

(a) providing a first voltage divider connected across power and ground having in serial connection a first fixed-value resistor to a first node to a second resistor with an adjustable value;

(b) providing a second voltage divider connected across power and ground having a serial connection of a third resistor, having a programmable resistance value and thermal and electrical characteristics substantially similar to the first resistor, to a second node to a fourth resistor having an adjustable value wherein the voltage at the second node is the analog control voltage;

(c) programming the resistance value of the third resistor in responsive to the digital control signal; and (d) simultaneously adjusting the second resistor and the fourth resistor so that the first node is held at a predetermined input voltage value.

10. The method in accordance with claim 9, wherein step (c) comprises executing, by a processor, a program for setting the digital control signal.

11. The method in accordance with claim 9, as performed by a bus driver apparatus included in the bus interface for generating a voltage output signal, wherein the at least one bus parameter includes one or more of parameters comprising rise and fall times of the voltage output signal, a high voltage limit for the voltage output signal, a low voltage limit for the voltage output signal, and a propagation time of the voltage output signal.

12. The method in accordance with claim 9, as performed by a bus receiver apparatus included in the bus interface, wherein the at least one bus operating and signaling parameter includes a threshold voltage for the bus receiver.

13. The method in accordance with claim 9, as performed by a bus terminator included in the bus interface; wherein the at least one bus operating and signaling parameter includes termination resistance provided by the bus terminator.

14. A bus interface with an electrical characteristic that is programmable in response to a digital control signal generated by a test and control circuit, the electrical characteristic determinative, at least in part, of at least one bus operating and signaling parameter, the interface comprising:

a bus driver with an output having an electrical characteristic responsive to a control voltage;

a first voltage divider connected across power and ground having in serial connection a first fixed-value resistor to a first node to a second resistor with an adjustable value;

a second voltage divider connected across power and ground having a serial connection of a third resistor, having a programmable resistance value and thermal and electrical characteristics substantially similar to the first resistor, to a second node to a fourth resistor having an adjustable value wherein the voltage at the second node is the control voltage;

a controller that is responsive to the digital control signal for programming the resistance value of the third resistor; and an adjustment circuit that simultaneously adjusts the second resistor and the fourth resistor so that the first node is held at a predetermined input voltage value.

15. The bus interface in accordance with claim 14 wherein the bus driver output electrical characteristic is rise and fall times of output signals generated at the bus driver output.

16. The bus interface in accordance with claim 14 wherein the bus driver output electrical characteristic is a high voltage limit of output signals generated at the bus driver output.

17. The bus interface in accordance with claim 14 wherein the bus driver output electrical characteristic is a low voltage limit of output signals generated at the bus driver output.

18. The bus interface in accordance with claim 14 wherein the bus driver output electrical characteristic is a propagation time of output signals generated at the bus driver output.

19. The bus interface in accordance with claim 14 further comprising a bus receiver with an input having an electrical characteristic responsive to the control voltage.

20. The bus interface in accordance with claim 19 wherein the bus receiver input electrical characteristic is a threshold voltage of the bus receiver input.

* * * * *